United States Patent
Kataoka

(10) Patent No.: US 9,496,481 B2
(45) Date of Patent: Nov. 15, 2016

(54) CONTROLLING DEVICE FOR VIBRATION TYPE ACTUATOR

(75) Inventor: Kenichi Kataoka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 721 days.

(21) Appl. No.: 13/992,351

(22) PCT Filed: Nov. 18, 2011

(86) PCT No.: PCT/JP2011/077270
§ 371 (c)(1),
(2), (4) Date: Jun. 7, 2013

(87) PCT Pub. No.: WO2012/081378
PCT Pub. Date: Jun. 21, 2012

(65) Prior Publication Data
US 2013/0257223 A1 Oct. 3, 2013

(30) Foreign Application Priority Data

Dec. 16, 2010 (JP) ................. 2010-280714

(51) Int. Cl.
 *H01L 41/09* (2006.01)
 *H02N 2/14* (2006.01)
 *H02N 2/10* (2006.01)

(52) U.S. Cl.
 CPC .............. *H01L 41/09* (2013.01); *H02N 2/142* (2013.01); *H02N 2/106* (2013.01)

(58) Field of Classification Search
 USPC ................................. 310/314–319
 See application file for complete search history.

(56) References Cited

U.S. PATENT DOCUMENTS

| 5,001,404 A | 3/1991 | Kataoka |
| 5,004,964 A * | 4/1991 | Kataoka et al. .............. 318/128 |
| 6,031,316 A | 2/2000 | Kataoka |

(Continued)

FOREIGN PATENT DOCUMENTS

| EP | 0 923 190 A2 | 6/1999 |
| JP | H05-111267 A | 4/1993 |

(Continued)

OTHER PUBLICATIONS

International Preliminary Report on Patentability dated Jun. 18, 2013, in International Application No. PCT/JP2011/077270.
Office Action Issued in Japanese Patent Application No. 2010-280714, dated Dec. 9, 2014.

*Primary Examiner* — Thomas Dougherty
(74) *Attorney, Agent, or Firm* — Fitzpatrick, Cella, Harper & Scinto

(57) ABSTRACT

A controlling device for a vibration type actuator includes an AC voltage generating unit in which at least one of parameters, namely a frequency, an amplitude, and a phase of an AC voltage for use in applying an excitation force to a vibrating member, is settable; a measuring unit which measures some physical quantities caused by a vibration of the vibrating member; a variation imparting unit which imparts a predetermined variation to at least one of the parameters of the AC voltage; a frequency-response characteristic measuring unit which finds a frequency-response characteristic of at least one predetermined frequency between a first signal according to the variation and a second signal according to the measured physical quantity; and a frequency controlling unit which controls the frequency of the AC voltage according to the frequency-response characteristic.

22 Claims, 13 Drawing Sheets

(56) References Cited

U.S. PATENT DOCUMENTS

| | | |
|---|---|---|
| 7,129,618 B2 | 10/2006 | Fujimoto et al. |
| 7,339,305 B2 | 3/2008 | Yamazaki et al. |
| 2002/0121869 A1* | 9/2002 | Kataoka .................. H02N 2/14 318/114 |
| 2005/0231069 A1* | 10/2005 | Yamazaki et al. ............ 310/317 |
| 2013/0241446 A1 | 9/2013 | Iwasa et al. |
| 2013/0257333 A1* | 10/2013 | Kataoka ................. H02N 2/142 318/503 |
| 2013/0334989 A1* | 12/2013 | Kataoka ........................ 318/116 |

FOREIGN PATENT DOCUMENTS

| | | |
|---|---|---|
| JP | 05-176562 A | 7/1993 |
| JP | H07-337043 A | 12/1995 |
| JP | 3138309 B2 | 2/2001 |
| JP | 2007-159291 A | 6/2007 |
| JP | 4192949 B2 | 12/2008 |
| JP | 2010-011716 A | 1/2010 |

* cited by examiner

CONTROLLING DEVICE FOR VIBRATION TYPE ACTUATOR

TECHNICAL FIELD

The present invention relates to a controlling device for a vibration type actuator which frictionally drives a moving member by a vibration wave by causing a vibrating member to generate the vibration wave by applying an AC voltage to an electrical-mechanical energy conversion element. The present invention particularly relates to a control technique of stabilizing transfer characteristics in a vibration type actuator.

BACKGROUND ART

The speed of the vibration type actuator changes according to the amplitude of the vibration wave, which is excited by the vibrating member. Therefore, the vibration type actuator is controlled by changing the amplitude or frequency of the AC voltage applied to the electrical-mechanical energy conversion element provided in the vibrating member.

In the control of this vibration type actuator, there are often used a method of controlling the vibration type actuator by changing the frequency of the AC voltage in order to reduce the effect of the resonant frequency variation of the vibrating member caused by a temperature or an individual difference in the resonant frequency of the vibrating member.

If a resonant frequency of the vibrating member or an internal loss thereof changes due to a change in the temperature in this control method, a change occurs in a frequency difference between the frequency of the AC voltage and the resonant frequency of the vibrating member even after controlling the frequency of the AC voltage applied to the electrical-mechanical energy conversion element in order to make the speed constant. This causes a change in the circuit efficiency or a variation in frequency-response characteristic.

Given this situation, PTL 1 suggests a controlling device for a vibration type actuator as described below.

This controlling device detects the vibration state of a vibrating member by using a vibration detector sensor and controls the frequency of an applied voltage so as to follow a change in the resonant frequency of the vibrating member while controlling a pulse width corresponding to the amplitude of the applied voltage so that the speed of the vibration type actuator is a desired speed.

Moreover, PTL 2 suggests a device which sequentially identifies a change in the DC gain out of the frequency-response characteristics of the rotational speed relative to the amplitude of the applied voltage of the vibration type actuator on the basis of the ratio of the speed to the amplitude of the applied voltage and then controls the frequency of the applied voltage to stabilize the change in the DC gain.

This enables a reduction in variation in open-loop transfer gain of a speed control loop so that the device is able to follow an environmental change caused by a change in the temperature or an individual difference.

CITATION LIST

Patent Literature

PTL 1: Japanese Patent Application Laid-Open No. H05-111267

PTL 2: Japanese Patent Application Laid-Open No. H07-337043

SUMMARY OF INVENTION

Technical Problem

The method disclosed in PTL 1 is capable of reducing the change in the frequency-response characteristic of the vibrating member, which is caused by the individual difference of the vibration type actuator and an environmental change, to some extent. The method, however, is not able to reduce a change in the frictional force, which is caused by a change in the contact state between the vibrating member and the moving member, or a change in the frequency-response characteristic, which is caused by an individual difference of a mechanism directly or indirectly connected to the moving member or by an environmental change, with high accuracy.

Moreover, in the case of driving the vibration type actuator at the resonant frequency, the control band is narrow in comparison with a case where the drive frequency is largely different from the resonant frequency, and therefore sufficient performance cannot be achieved for a use which needs a wideband control.

Further, in the method of detecting a resonant state on the basis of a phase difference between the vibration detector sensor provided in the vibrating member and the applied voltage, an offset is sometimes superimposed on a phase difference due to a change in the pressure-contact state between the vibrating member and the moving member if the amplitude of the vibrating member is small, which causes an unstable condition.

Moreover, in the method disclosed in PTL 2, a DC gain having an open-loop transfer characteristic is stabilized by controlling a difference between the frequency of the applied voltage and the resonant frequency of the vibrating member. The method, however, is not necessarily satisfactory in the stabilization of the phase characteristic.

Therefore, it is necessary to make a design or the like in which a sufficient margin is provided for the characteristic of the speed compensator in prospect of a change in the phase characteristic.

In view of the above problem, it is an object of the present invention to provide a controlling device for a vibration type actuator capable of controlling the frequency of an applied voltage with high accuracy by following a change in the frictional force or a change in the frequency-response characteristic, which is caused by an environmental variation or an individual difference, and further capable of improving the control with following the change in the frequency-response characteristic even during low-speed operation in which the amplitude of the vibrating member is small.

Solution to Problem

According to the present invention, there is provided a controlling device for a vibration type actuator in which a moving member, which is put in contact with or indirectly connected to a vibrating member, relatively moves by using a vibration wave excited by the vibrating member due to a frictional force generated by the vibration wave, the controlling device including: an AC voltage generating unit in which at least one of parameters, namely a frequency, an amplitude, and a phase of an AC voltage for use in applying an excitation force to the vibrating member is settable; a measuring unit which measures at least one of physical quantities: the vibration of the vibrating member or a mechanism connected to the vibrating member, which changes according to the vibration of the vibrating member; the sound propagating in a medium surrounding the vibrating member; and the speed, the position, and a force to be output of the moving member; a variation imparting unit which imparts a predetermined variation to at least one of the parameters, namely the frequency, the amplitude, and the phase of the AC voltage; a frequency-response characteristic measuring unit which finds a frequency-response characteristic of at least one predetermined frequency between a first signal according to the variation imparted by the variation imparting unit and a second signal according to the physical quantity measured by the measuring unit; and a frequency controlling unit which controls the frequency of the AC voltage according to the frequency-response characteristic found by the frequency-response characteristic measuring unit.

Moreover, the present invention provides a controlling device for a vibration type actuator in which a moving member, which is put in contact with or indirectly connected to a vibrating member, relatively moves by using a vibration wave excited by the vibrating member due to a frictional force generated by the vibration wave, the controlling device including: an AC voltage generating unit in which at least one of parameters, namely a frequency, an amplitude, and a phase of an AC voltage for use in applying an excitation force to the vibrating member is settable; a measuring unit which measures at least one of physical quantities: the vibration amplitude of the vibrating member, which changes according to the vibration of the vibrating member; and the speed, the position, and a force to be output of the moving member; a control operation unit which performs a predetermined control operation according to a result of a comparison between a value based on the physical quantity measured by the measuring unit and a target value; a variation imparting unit which imparts a predetermined variation to at least one of the parameters, namely the frequency, the amplitude, and the phase of the AC voltage; a frequency-response characteristic measuring unit which finds a phase characteristic, which is a frequency-response characteristic of at least one predetermined frequency between a first signal according to the variation imparted by the variation imparting unit and a second signal according to an output from the control operation unit or the physical quantity measured by the measuring unit; and a first adjusting unit which sets at least one of the parameters, namely the frequency, the amplitude, and the phase of the AC voltage according to the phase characteristic.

Advantageous Effects of Invention

According to the present invention, it is possible to achieve a controlling device for a vibration type actuator capable of controlling the frequency of an applied voltage with high accuracy by following a change in the frictional force or a change in the frequency-response characteristic, which is caused by an environmental variation or an individual difference, and further capable of improving the control with following the change in the frequency-response characteristic even during low-speed operation in which the amplitude of the vibrating member is small.

Further features of the present invention will become apparent from the following description of exemplary embodiments with reference to the attached drawings.

DESCRIPTION OF EMBODIMENTS

Preferred embodiments of the present invention will now be described in detail in accordance with the accompanying drawings.

Best modes for carrying out the present invention will now be described by way of the following embodiments.

EMBODIMENTS

First Embodiment

A configuration example of a controlling device for a vibration type actuator to which the present invention is applied will now be described below as a first embodiment.

The vibration type actuator vibrates an elastic member made of metal or ceramic by using a resonance phenomenon in a natural vibration mode to relatively move a moving element put in contact with or indirectly connected to the elastic member. These days, actuators having various principles are suggested.

Although a piezoelectric element is mostly used as a generation source of an excitation force for excitation, any exciting unit may be used to achieve the generation source in principle. For example, the excitation is achieved by using various actuators such as a magnetostrictive element, an electrostrictive element, a voice coil, a static actuator, and the like.

These actuators are able to generate an excitation force by inputting an AC voltage or AC current having the same frequency as the excitation frequency. The AC voltage to be applied corresponds to the excitation force in the case of a piezoelectric element, and the AC current corresponds to the excitation force in the case of a voice coil. In the following, description is made by taking the piezoelectric element as an example.

Figure 2A:
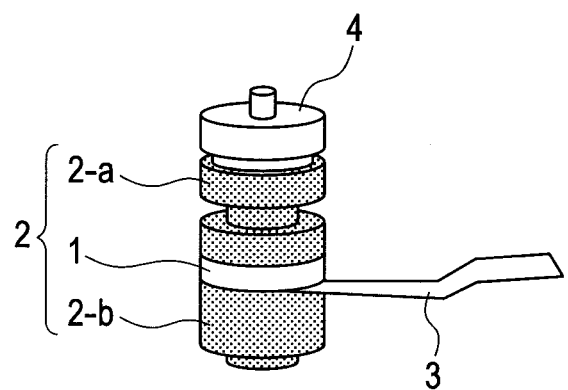
FIG. 2A is a configuration diagram illustrating an example of the vibration type actuator in the first embodiment of the present invention.
Figure 2B:
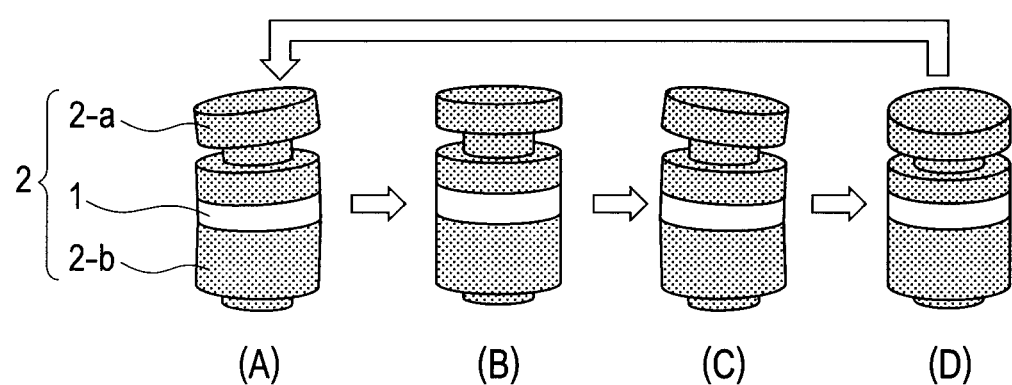
FIG. 2B is a diagram illustrating the condition of the vibration of the vibration type actuator in the first embodiment of the present invention.

FIG. 2A is a configuration diagram illustrating an example of a vibration type actuator, and FIG. 2B is a diagram illustrating the condition of the vibration of the vibration type actuator.

In these diagrams, a reference numeral 1 indicates a piezoelectric element, and elastic members 2-$a$ and 2-$b$ clamp the piezoelectric element 1.

The piezoelectric element 1 and the elastic members 2-$a$ and 2-$b$ constitute a vibrating member 2 in an integrated manner. A flexible substrate 3 is for use in supplying power to the piezoelectric element 1 and a rotor 4 rotates by a frictional force generated between the elliptical vibration formed on the upper surface of the vibrating member 2 and the rotor 4.

For the vibrating member 2, there is a natural vibration mode of bending vibrations in two directions orthogonal to each other. If these two vibrations in the natural vibration mode are generated with the phase displaced by 90° in terms of time, the upper structure of the vibrating member 2 rotationally vibrates so as to rotate swinging with the constricted portion as a supporting point as illustrated in FIG. 2B.

The force of the vibration is transmitted to the rotor 4 pressed to the upper part of the vibrating member 2 by a pressurizing unit, which is not illustrated, via a frictional force and then a rotation output is extracted.

Figure 3:
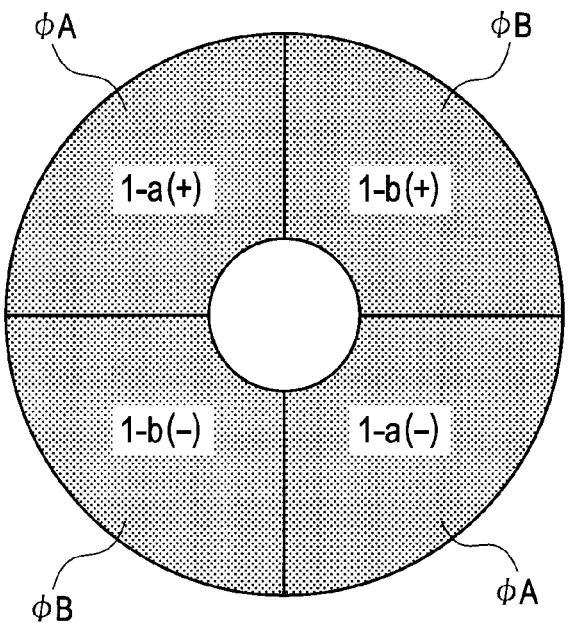
FIG. 3 is a diagram illustrating a power feeding electrode pattern provided in a piezoelectric element in the first embodiment of the present invention.

FIG. 3 illustrates a power feeding electrode pattern formed on the piezoelectric element 1.

The electrode is divided into four sections. An AC voltage of $\phi A$ or $\phi B$ is supplied to the respective electrodes via the flexible substrate 3.

The signs of the electrodes 1-$a$(+), 1-$a$(−), 1-$b$(+), and 1-$b$(−) of the piezoelectric element 1 indicate the polarization directions of the piezoelectric element 1, and the opposing electrodes are polarized in the opposite direction.

In addition, the same drive voltage is applied to the opposing electrodes to generate oppositely-oriented excitation forces, by which a vibration in a single natural vibration mode is excited so as to correspond to each of $\phi A$ and $\phi B$.

Figure 4:
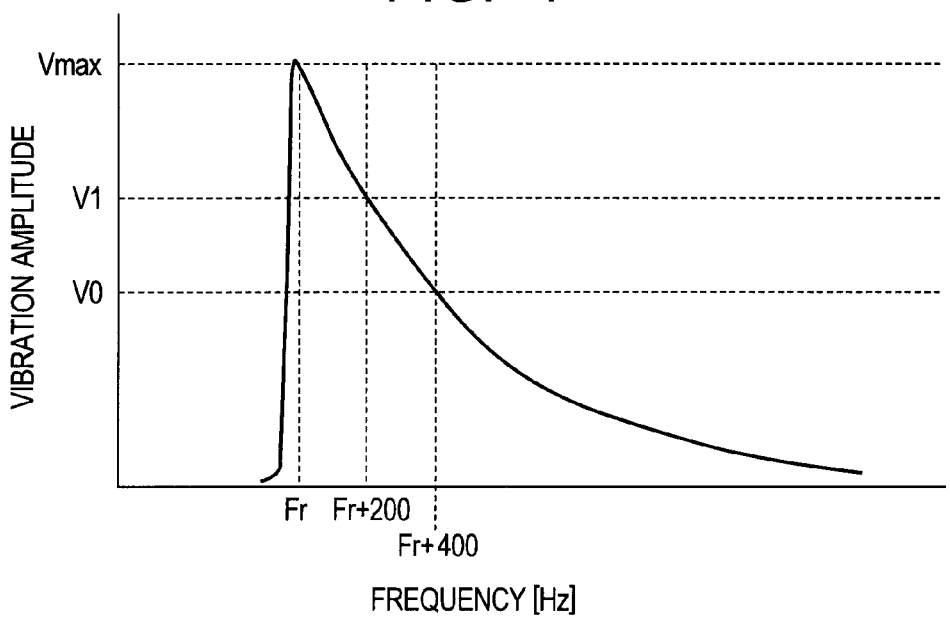
FIG. 4 is a diagram illustrating a relationship between the vibration frequency of a vibrating member and the vibration amplitude of the vibrating member in the first embodiment of the present invention.

FIG. 4 is a diagram illustrating a relationship between the frequency of a vibration excited by the vibrating member 2 of the vibration type actuator and the vibration amplitude of the vibrating member 2.

Character Fr indicates a resonant frequency of the vibrating member 2. In the resonant frequency Fr, Vmax indicates the vibration amplitude of the vibrating member 2. Moreover, as the frequency comes closer to the resonant frequency Fr from a region higher than the resonant frequency Fr, the vibration amplitude of the vibrating member 2 increases gradually and comes closer to Vmax. Then, the vibration amplitude rapidly decreases at frequencies lower than the resonant frequency Fr, thus having dissymmetric characteristics. Further, the vibration amplitude of the vibrating member 2 is V1 at a frequency 200 Hz higher than the resonant frequency Fr and is V0 at a frequency 400 Hz higher than the resonant frequency Fr. Comparing the rate of the vibration amplitude change of the vibrating member 2 relative to the frequency change between the frequencies, a higher rate of change is observed at a frequency 200 Hz higher than the resonant frequency Fr in comparison with the rate of change at a frequency 400 Hz higher than the resonant frequency Fr.

Figure 5A:
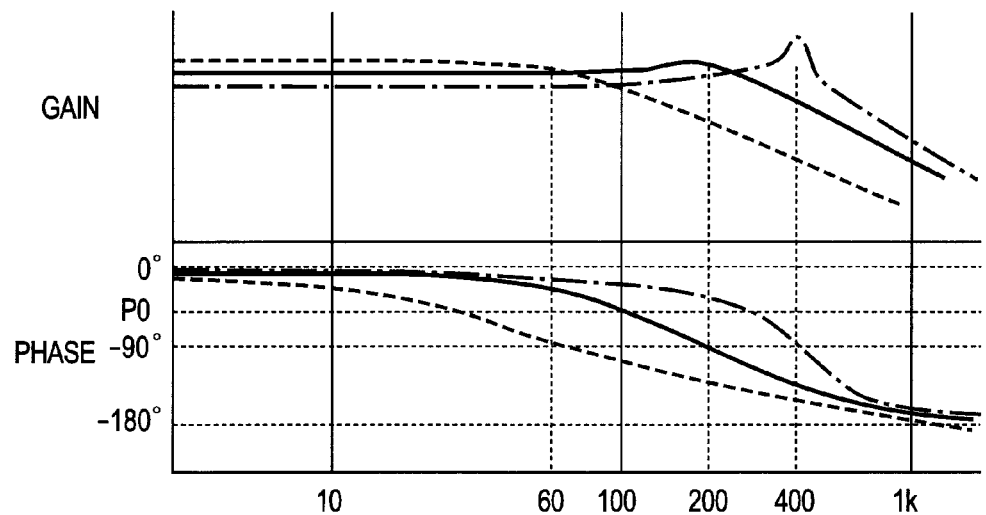
FIG. 5A is a Bode diagram illustrating a frequency-response characteristic of the vibration amplitude of the vibrating member relative to the frequency of the AC voltage applied to the piezoelectric element in the first embodiment of the present invention.

FIG. 5A is a Bode diagram illustrating a frequency-response characteristic of the vibration amplitude change of the vibrating member 2 relative to the change in the frequency of the AC voltage for exciting the vibrating member 2 of the vibration type actuator.

The solid line represents a characteristic obtained when the frequency of the AC voltage is changed around a frequency 200 Hz higher than the resonant frequency Fr illustrated in FIG. 4. The long dashed short dashed line represents a characteristic obtained when the frequency of the AC voltage is changed around a frequency 400 Hz higher than the resonant frequency Fr.

Moreover, a dashed line represents a characteristic obtained when the frequency of the AC voltage is changed around the vicinity of the resonant frequency Fr.

In the frequency-response characteristic of the vibration type actuator using the resonance characteristic, a break frequency changes so as to be generally dependent on the Q value of the vibrating member in the vicinity of the resonant frequency Fr.

Moreover, in the frequency region far from the resonant frequency Fr, a break frequency changes so as to be dependent on a difference between the resonant frequency Fr and the average frequency of the AC voltage for exciting the vibrating member 2.

The solid line represents a characteristic obtained when the frequency of the AC voltage is changed around a frequency 200 Hz higher than the resonant frequency Fr, and therefore the gain damps with almost 200 Hz as a break frequency in the characteristic.

The long dashed short dashed line represents a characteristic obtained when the frequency of the AC voltage is changed around a frequency 400 Hz higher than the resonant frequency Fr, and therefore the gain damps with almost 400 Hz as a break frequency in the characteristic.

Further, the phase characteristic is substantially −90° at each of the aforementioned break frequencies, and it is understood that the phase characteristics converge to the vicinity of −180° as the frequency increases.

The dashed line represents the characteristic obtained when the frequency of the AC voltage is changed around the vicinity of the resonant frequency Fr.

Although the frequency difference between the frequency of the AC voltage and the resonant frequency Fr is close to zero, the break frequency is 60 Hz.

The break frequency is determined dependently on the Q value representing the vibration performance of the vibrating member 2. As the frequency difference between the frequency of the AC voltage and the resonant frequency Fr decreases, the break frequency converges to the lower limit frequency (60 Hz in this embodiment).

The following describes the magnitude of gain in the low-frequency area.

As illustrated in FIG. 4, the rate of change of the vibration amplitude of the vibrating member 2 increases as the frequency of the AC voltage comes closer to the resonant frequency Fr with regard to the vibration amplitude change of the vibrating member 2 relative to the frequency change of the AC voltage.

Therefore, gain increases as the frequency of the AC voltage is closer to the resonant frequency Fr of the vibrating member 2. Also in the frequency region of 10 Hz or lower in FIG. 5A, gain increase as the frequency of the AC voltage comes closer to the resonant frequency Fr, thus representing the same characteristic as in FIG. 4.

Moreover, although FIG. 5A is a Bode diagram illustrating the characteristic of the vibration amplitude change of the vibrating member 2 relative to the frequency change of the AC voltage, the similar characteristic is observed also with respect to the vibration amplitude change of the vibrating member 2 relative to the amplitude or phase change of the AC voltage.

With respect to the relationship between a difference between the resonant frequency Fr and the frequency of the AC voltage and the aforementioned break frequency, the frequency difference is close to the break frequency in the region in which the frequency difference is large also regarding any control input of the frequency, the amplitude, and the phase, and the displacement is large in the case where the frequency difference is close to zero.

Figure 5B:
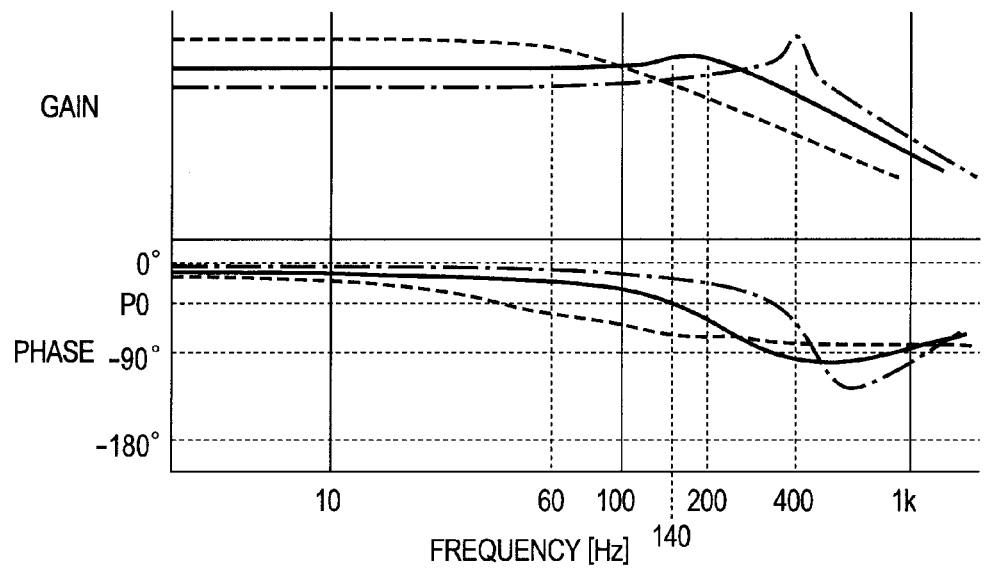
FIG. 5B is a Bode diagram illustrating a frequency-response characteristic of the vibration amplitude of the vibrating member relative to the amplitude of the AC voltage applied to the piezoelectric element in the first embodiment of the present invention.

FIG. 5B is a Bode diagram illustrating a characteristic of the amplitude change of the vibrating member relative to the amplitude change of the AC voltage.

FIG. 5B differs from FIG. 5A in that the phase change is totally less and the peak value of the phase change varies with the frequency of the AC voltage.

The differences in characteristics represented by the solid line, the dashed line, and the long dashed short dashed line are the same as those of FIG. 5A, and therefore the description thereof is omitted here. In addition, it is understood that the difference in gain caused by the difference in frequency of the AC voltage is large in comparison with FIG. 5A.

The relationship between the break frequency and the frequency of the AC voltage which appears in the phase characteristic in the Bode diagram is not a property peculiar to the vibration type actuator illustrated in FIGS. 2A and 2B.

Although the vibrating member 2 is composed of the elastic members 2-*a* and 2-*b* and the piezoelectric element 1 in FIG. 2A, the vibrating member 2 may be composed of only a piezoelectric element or other exciting units. In addition, although FIG. 2A illustrates a rod-like vibrating member, there are vibration type actuators made of annular, discoid, rectangular plate-like, or any other various-shaped elastic members and piezoelectric elements combined with each other.

Most of these vibration type actuators use the resonance characteristic of the vibrating member made of elastic members and piezoelectric elements and relatively move a moved member which is put in contact with the vibrating member by forming a vibration wave in the vibrating member into a vibration shape dependent on the natural vibration mode of the vibrating member.

As long as it has a property of using the resonance phenomenon, the vibration type actuator has a frequency-response characteristic as illustrated in FIGS. 5A and 5B, and therefore this suggestion is valid as long as the vibration type actuator uses the resonance phenomenon.

Figure 1:
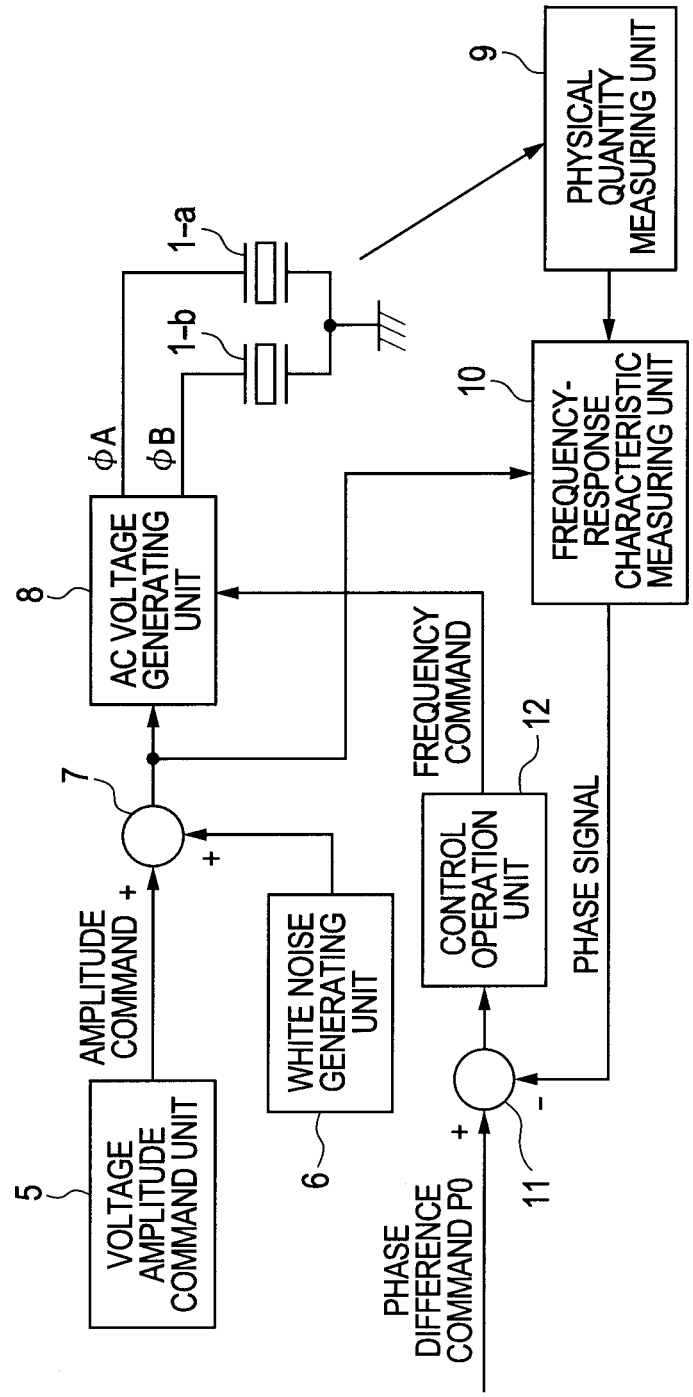
FIG. 1 is a block diagram for describing a first configuration example of a controlling device for a vibration type actuator according to a first embodiment of the present invention.

FIG. 1 is a block diagram for describing a first configuration example of the controlling device for the vibration type actuator according to this embodiment.

The block diagram illustrates a configuration example of the device for controlling the frequency so that the vibration frequency of the vibrating member 2, which is not illustrated, composed of piezoelectric elements 1-*a* and 1-*b* and elastic members 2-*a* and 2-*b*, which are not illustrated, follows the frequency away from the resonant frequency Fr by a certain frequency.

A voltage amplitude command unit 5 issues a command of the amplitude of an AC voltage applied to the piezoelectric elements 1-*a* and 1-*b*.

A white noise generating unit 6 generates a white noise, and an addition unit 7 generates a new amplitude command by adding the white noise output from the white noise generating unit 6 to the amplitude command output from the voltage amplitude command unit 5.

The white noise generating unit 6 and the addition unit 7 constitute a variation imparting unit which gives a predetermined variation to at least one of parameters: the frequency, the amplitude, and the phase of the AC voltage for applying an excitation force to the vibrating member.

In this embodiment, the variation imparting unit may have a configuration which imparts not only the aforementioned white noise, but also one of a sine-wave signal, a pseudo-random signal, and the like.

An AC voltage generating unit 8 generates a two-phase AC voltage according to an amplitude command to which the white noise output from the addition unit 7 is added and a frequency command described later, applying AC voltages φA and φB with a phase difference of 90° to the piezoelectric elements 1-*a* and 1-*b*.

A physical quantity measuring unit 9 is able to measure some physical quantities resulting from the vibration of the vibrating member 2, which is not illustrated, according to a command from a command unit, which is not illustrated.

For example, the physical quantity measuring unit 9 is able to detect various physical quantities such as the vibration of the vibrating member 2 or a housing, which is not illustrated, for fixing the vibrating member 2, the sound pressure around the vibrating member 2, the rotational speed of the rotor 4 pressure-contacted to the vibrating member 2, and the force output from the rotor 4.

In this embodiment, the physical quantity measuring unit 9 is configured so as to be able to measure at least one of physical quantities: the vibration of the vibrating member or a mechanism connected to the vibrating member, which changes according to the vibration of the vibrating member; the sound propagating in a medium surrounding the vibrating member; and the speed, the position, and a force to be output of the moving member.

A frequency-response characteristic measuring unit 10 measures a frequency-response characteristic of the physical quantity output from the physical quantity measuring unit 9 relative to a change in the amplitude command to which the white noise output from the addition unit 7 is added.

The frequency-response characteristic is able to be represented by the Bode diagrams illustrated in FIGS. 5A and 5B. In this embodiment, the physical quantity measuring unit 9 outputs a phase signal corresponding to a phase at a predetermined frequency out of the characteristics of the gain and phase.

A phase difference comparison unit 11 finds a difference between a phase difference command from a command unit, which is not illustrated, and a phase signal at a predetermined frequency output from the frequency-response characteristic measuring unit 10.

A control operation unit 12 controls the frequencies of the AC voltages applied to the piezoelectric elements 1-a and 1-b according to the comparison result output from the phase difference comparison unit 11.

In this embodiment, the phase difference comparison unit 11 and the control operation unit 12 constitute a frequency controlling unit which controls the frequencies of the AC voltages according to the frequency-response characteristics found by the frequency-response characteristic measuring unit. Thereafter, the frequency controlling unit controls the frequencies of the AC voltages according to the phase characteristics found by the frequency-response characteristic measuring unit. In so doing, the frequency controlling unit controls the frequencies of the AC voltages so that the phase characteristics match the predetermined target phases.

Hereinafter, specific operations in these controls will be described by using the characteristics in FIG. 5B. Here, it is discussed that the vibration frequency of the vibration type actuator is driven at a frequency 200 Hz higher than the resonant frequency Fr of the vibrating member, which is not illustrated.

In the vibration type actuator, the temperature of the vibrating member, which is not illustrated, increases during the driving and the resonant frequency Fr changes.

Therefore, if the frequencies of the AC voltages applied to the piezoelectric elements 1-a and 1-b are fixed in advance, the differences between the frequencies of the AC voltages and the resonant frequency Fr change according to a temperature change.

Therefore, in order to make the frequencies of the AC voltages to be applied to the piezoelectric elements 1-a and 1-b always follow the frequency 200 Hz higher than the resonant frequency Fr of the vibrating member 2, it is necessary to detect a change in the resonant frequency Fr of the vibrating member 2 in some way.

Conventionally, for this purpose, there are used a lot of methods of detecting a change in the vibration amplitude of the vibrating member, a change in a temporal phase difference between the AC voltages applied to the piezoelectric elements 1-a and 1-b and the vibration of the vibrating member according to a change in the resonant frequency Fr, and the like with the vibrating member, which is not illustrated, provided with a vibration detector sensor.

In these methods, however, the detection accuracy of the frequency change is low particularly in the region where the vibration amplitude of the vibrating member, which is not illustrated, is small due to an effect of the position in which the vibration detector sensor is disposed, a sensitivity error, or the like.

Accordingly, in this embodiment, it is focused on changes in various frequency-response characteristics of the vibration type actuator according to the frequency difference between the resonant frequency Fr of the vibrating member 2 and the frequencies of the AC voltages applied to the piezoelectric elements 1-a and 1-b. Then, the controlling device is configured so that these changes are stabilized to make the frequencies of the AC voltages follow the changes in the resonant frequency Fr of the vibrating member 2 with a certain frequency difference.

The following describes a method of making the frequencies of the AC voltages follow the resonant frequency Fr of the vibrating member 2 with a certain frequency difference in this embodiment.

In this embodiment, the frequency-response characteristic measuring unit finds a frequency-response characteristic of at least one predetermined frequency between a first signal according to a variation imparted by the variation imparting unit composed of the white noise generating unit and the addition unit 7 and a second signal according to the physical quantity measured by the measuring unit which measures physical quantities.

More specifically, the frequency-response characteristic measuring unit 10 sequentially measures phase characteristics at a predetermined frequency of a change in the physical quantity output from the physical quantity measuring unit 9 relative to the change in the amplitude command to which the white noise is added.

Here, it is assumed that the phase characteristic of 140 Hz is measured with the state represented by the solid line in FIG. 5B considered to represent a target frequency-response characteristic.

In the phase characteristic of 140 Hz, a phase lag increases as the frequencies of the AC voltages applied to the piezoelectric elements 1-a and 1-b are closer to the resonant frequency Fr of the vibrating member 2.

Moreover, in the case where the frequencies of the AC voltages, which will be applied to the piezoelectric elements 1-a and 1-b, are 200 Hz higher than the resonant frequency of the vibrating member 2, the phase characteristic at the frequency of 140 Hz is P0. Therefore, if the phase characteristic at the frequency of 140 Hz is greater than the phase difference command P0 from the command unit, which is not illustrated, the frequencies of the AC voltages applied to the piezoelectric elements 1-a and 1-b are brought close to the resonant frequency Fr of the vibrating member 2. Thereby, if the phase characteristic is smaller than P0, the phase characteristic can be stabilized by bringing the frequencies of the AC voltages far from the resonant frequency Fr. Therefore, the phase difference comparison unit 11 compares the phase difference command P0 from the command unit, which is not illustrated, with the phase signal indicating the phase characteristic at the frequency of 140 Hz output from the frequency-response characteristic measuring unit 10.

Then, the control operation unit 12 performs an integral calculation to set a frequency command in the AC voltage generating unit 8 so that the phase signal output from the frequency-response characteristic measuring unit 10 coincides with the phase difference command P0.

With the operation in this configuration, the vibration frequency of the vibrating member 2 is sequentially controlled so as to follow a change in the resonant frequency Fr of the vibrating member 2 so that the phase characteristic at 140 Hz always coincides with the phase difference command P0, and the difference between the resonant frequency Fr and the vibration frequency is controlled to the vicinity of 200 Hz.

The predetermined frequency for finding the aforementioned frequency-response characteristic is preferably lower than the difference frequency between the frequency of the AC voltage and the resonant frequency and equal to or higher than one tenth of the difference frequency.

Although the above description has been made with respect to an example that the physical quantity measuring unit 9 detects the vibration amplitude of the vibrating member 2, the physical quantity is not limited thereto as long as the physical quantity changes according to the vibration amplitude of the vibrating member 2. While the characteristic illustrated in FIG. 5B is the frequency-response characteristic of the vibration amplitude of the vibrating member 2, it is because the physical quantity includes the frequency characteristic of the vibration amplitude of the vibrating member 2 as a basic characteristic as long as the physical quantity changes according to the vibration amplitude of the vibrating member 2.

Generally, a characteristic change in other physical quantities is less than a frequency-response characteristic change in the vibration amplitude of the vibrating member 2. Therefore, in most cases where other physical quantities are measured, the phase signal output from the frequency-response characteristic measuring unit 10 offsets the characteristic of FIG. 5B by a certain quantity. Therefore, even if the frequency-response characteristic is stabilized by detecting any other physical quantity, almost the same effect is expected.

This effect stabilizes the frequency-response characteristic of the vibrating member 2 and enables a vibration control with less individual differences from small amplitude to large amplitude.

Further, although the above embodiment has been described by taking an example of the vibration type actuator using two natural vibration modes, it is natural that the same effect is achieved independently of the number of natural vibration modes as long as the resonance characteristic in the natural vibration mode is used.

Moreover, the physical quantity measuring unit 9 may switch the physical quantity to be measured in response to a command from a command unit, which is not illustrated, according to a purpose.

Further, the physical quantity measuring unit 9 may switch the frequency to be measured according to a purpose or may measure the phase characteristics with a plurality of frequencies periodically switched and then average the measured phase characteristics before use.

Subsequently, a second configuration example of the controlling device for the vibration type actuator in this embodiment will be described by using a block diagram illustrated in FIG. 6.

Relative to the first configuration example in FIG. 1, the white noise generating unit 6 is replaced with a known M-sequence random number generating unit 13, a vibration detector sensor 1-*c* using a piezoelectric element is provided in the vibrating member 2, which is not illustrated, and a vibration amplitude measuring unit 14 is disposed in place of the physical quantity measuring unit 9.

Moreover, a specific configuration of the frequency-response characteristic measuring unit 10 is illustrated.

The amplitude command output from the addition unit 7 has a variation, which is superimposed on the amplitude command, having a uniform frequency characteristic in a wide frequency range in the frequency band corresponding to a sampling frequency for M-sequence random number generation.

The AC voltage generating unit 8 samples the amplitude command on which an M-sequence random number is superimposed for each cycle of the output AC voltage and determines the amplitude of one cycle of the AC voltage.

The voltage amplitude actually set as the amplitude of the AC voltage and the setting timing correspond to timing at which the AC voltage waveform is actually output, and therefore the voltage amplitude signal is output at the timing.

Hereinafter, the configuration of the frequency-response characteristic measuring unit will be described.

In this embodiment, the frequency-response characteristic measuring unit measures a phase characteristic at 140 Hz between a voltage amplitude signal output from the AC voltage generating unit 8 and a vibration amplitude signal output from the vibration amplitude measuring unit 14.

In principle, the waveform generating section generates a sine wave and a cosine wave of 140 Hz, these waveforms are multiplied by each of the voltage amplitude signal and the vibration amplitude signal and then smoothed, the respective phases are found, and the phase of the vibration amplitude signal is subtracted from the phase of the voltage amplitude signal to find a phase characteristic.

Subsequently, blocks will be described.

Low-pass filters 15 and 16 have the same cutoff frequency which is lower than the frequency of the AC voltage output from the AC voltage generating unit 8 and is about 10 times higher than 140 Hz.

A sine wave generating unit 17 generates a sine wave of 140 Hz, and a cosine wave generating unit 18 generates a cosine wave of 140 Hz.

Multiplication units (multiplication operation sections) 19, 20, 21, and 22 multiply the band-limited voltage amplitude signal and vibration amplitude signal, which are output from the low-pass filters 15 and 16 which perform a filtering calculation, by the sine wave and the cosine wave and then outputs the result of the multiplication.

Each of the output signals of the multiplication units 19, 20, 21, and 22 has an offset value and has a waveform modulated by a frequency of 140 Hz doubled.

The respective waveforms are smoothed by low-pass filters 23, 24, 25, and 26 each having a cutoff frequency of 1 Hz on the next stage to find the phases of the voltage amplitude signal and the vibration amplitude signal by using arctangent calculation units 27 and 28 and then to find phase differences in a phase difference detecting unit 29.

Although the outputs of the arctangent calculation units 27 and 28 are input to the phase difference detecting unit 29 in the above, the outputs may be input via the low-pass filters again.

The low-pass filters connected in series in each of two or three stages described here need to have the same cutoff frequency in the same stage.

Naturally, the cutoff frequency of the low-pass filters in each stage may be other than the cutoff frequency described in this specification.

Moreover, a sinc filter which is a known decimation filter may be used as a low-pass filter.

The use of the sinc filter decreases a sampling rate, thereby enabling a reduction in the calculation amount.

Second Embodiment

A configuration example of a controlling device for a vibration type actuator in a second embodiment will be described below.

Figure 7:
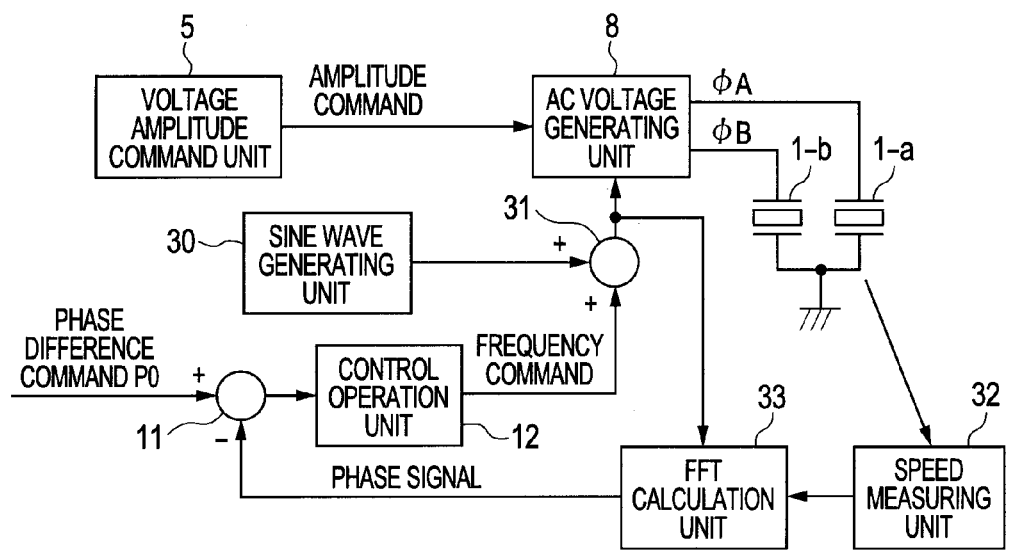
FIG. 7 is a block diagram for describing a configuration example of a controlling device for a vibration type actuator in a second embodiment of the present invention.

FIG. 7 is a block diagram for describing the configuration example of the controlling device for the vibration type actuator in this embodiment.

Hereinafter, a difference between this embodiment and the first embodiment will be described.

While the white noise generating unit changes the amplitude command to the AC voltage generating unit 8 in the first embodiment, a sine wave generating unit 30 described later superimposes a variation on the frequency command in this embodiment.

Figure 8:
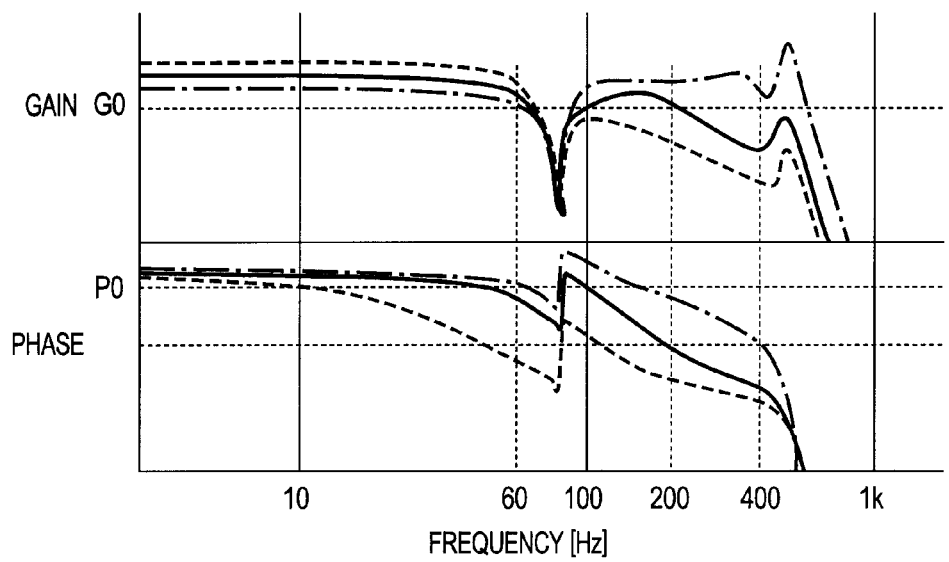
FIG. 8 is a Bode diagram illustrating a frequency-response characteristic of the rotor speed relative to the frequency of the AC voltage applied to piezoelectric element in the second embodiment of the present invention.

FIG. 8 illustrates a frequency-response characteristic of a change in rotational speed of the rotor 4 relative to the frequency change in the AC voltage applied to the piezoelectric elements 1-a and 1-b.

In FIG. 8, the dashed line represents a characteristic of a frequency of the AC voltage which is in the vicinity of the resonant frequency Fr of the vibrating member 2, the solid line represents a characteristic of a frequency of the AC voltage which is 200 Hz higher than the resonant frequency Fr of the vibrating member 2, and the long dashed short dashed line represents a characteristic of a frequency of the AC voltage which is 400 Hz higher than the resonant frequency Fr.

Subsequently, the operation of this embodiment will be described by using the frequency-response characteristics in FIG. 8.

Reference numerals 30 and 31 indicate a sine wave generating unit and an addition unit, respectively. The addition unit 31 adds a sine wave having a predetermined frequency output from the sine wave generating unit 30 to a frequency command output from a control operation unit 12 described later and outputs the frequency command, which changes in a sine wave form, to the AC voltage generating unit.

The AC voltage generating unit 8 generates a two-phase AC voltage having an amplitude based on the amplitude command of the voltage amplitude command unit 5 and a frequency based on the frequency command on which the sinusoidal variation output from the addition unit 31 is superimposed.

A speed measuring unit 32 is an optical rotary encoder which detects the rotational speed of a rotor 4, which is not illustrated.

The rotational speed of the rotor 4 changes largely in proportion to the vibration amplitude of the vibrating member 2 and thus has the same characteristic as the frequency-response characteristic of the vibration amplitude in the low-frequency region.

In the high-frequency region, the rotational speed of the rotor 4 has a slightly different characteristic due to the torsional stiffness between the rotary encoder and the rotor 4, which is not illustrated, and an effect of a resonant system caused by a moment of inertia of a scale of the rotary encoder, an inertial load of the gear connected to the rotor 4 or of other components, the stiffness of a coupling for concatenation, or the like.

The torsional stiffness and the moment of inertia, however, are not varied so largely by an individual difference or an environmental change, and therefore a change in the frequency-response characteristic mostly depends on a change in the vibration amplitude characteristic of the vibrating member 2, which is not illustrated.

The rapid decline of the gain characteristic in the vicinity of 80 Hz, the slightly discontinuous phase characteristic, and the characteristic related to a peak characteristic in the frequencies higher than 400 Hz of the frequency-response characteristics in FIG. 8 are mainly caused by an effect of a mechanical resonant system other than the vibration amplitude of the vibrating member 2.

An FFT calculation unit 33 performs a known fast Fourier calculation.

In this specification, the FFT calculation unit 33 finds a phase characteristic of a change in the speed output from a speed detecting unit in response to a frequency command on which a sinusoidal variation output from the addition unit 31 is superimposed and outputs a phase signal indicating a phase characteristic of the frequency of a sine wave output from the sine wave generating unit 30.

A phase difference comparison unit 11 compares a phase difference command P0 from the command unit, which is not illustrated, with a phase signal. Then, a control operation unit 12 finds a frequency command for setting a frequency of the AC voltage output from the AC voltage generating unit by a proportional integral calculation so that the phase difference command coincides with the phase signal according to the comparison result.

The following describes the operation of matching the phase command with the phase signal.

It is assumed that the sine wave generating unit 30 generates a sine wave of 100 Hz. Similarly to the first embodiment, the frequency-response characteristic targets on the characteristic achieved by a difference of 200 Hz between the resonant frequency Fr of the vibrating member 2 and the frequency of the AC voltage.

With reference to FIG. 8, the target frequency-response characteristic is represented by a solid line, and therefore the phase characteristic at 100 Hz is P0.

Therefore, the operation will be described with the phase difference command from the command unit, which is not illustrated, considered as P0. In the phase characteristic at 100 Hz, the phase lag increases as the difference between the resonant frequency Fr of the vibrating member 2 and the frequency of the AC voltage decreases.

It can be confirmed from the characteristic represented by a dashed line in the case where the frequency of the AC voltage is in the vicinity of the resonant frequency Fr of the vibrating member 2.

Therefore, when the lag in the phase characteristic is small, the frequency of the AC voltage is higher than the target frequency. In contrast, when the lag is large, the frequency of the AC voltage is closer to the resonant frequency Fr of the vibrating member 2 than to the target frequency.

With the use of this characteristic, the frequency command is controlled so as to achieve P0 as the phase characteristic at 100 Hz, thereby enabling the stabilization of the phase characteristic similarly to the first embodiment.

Moreover, although the frequency-response characteristic has been detected by using the result of detecting the speed of the rotor 4, the same effect is achievable by using the physical quantity detecting unit described in the first embodiment.

Further, although the sine wave generating unit 30 has been used to impart a variation to the frequency command in this embodiment, a frequency response may be measured for variations caused by the white noise generating unit, the M-sequence random number generating unit, and other variation imparting units.

The FFT calculation unit in this embodiment is one of units for measuring the frequency-response characteristic, and naturally any other method may be used.

Third Embodiment

A configuration example of a controlling device for a vibration type actuator in a third embodiment will be described below.

Figure 9:
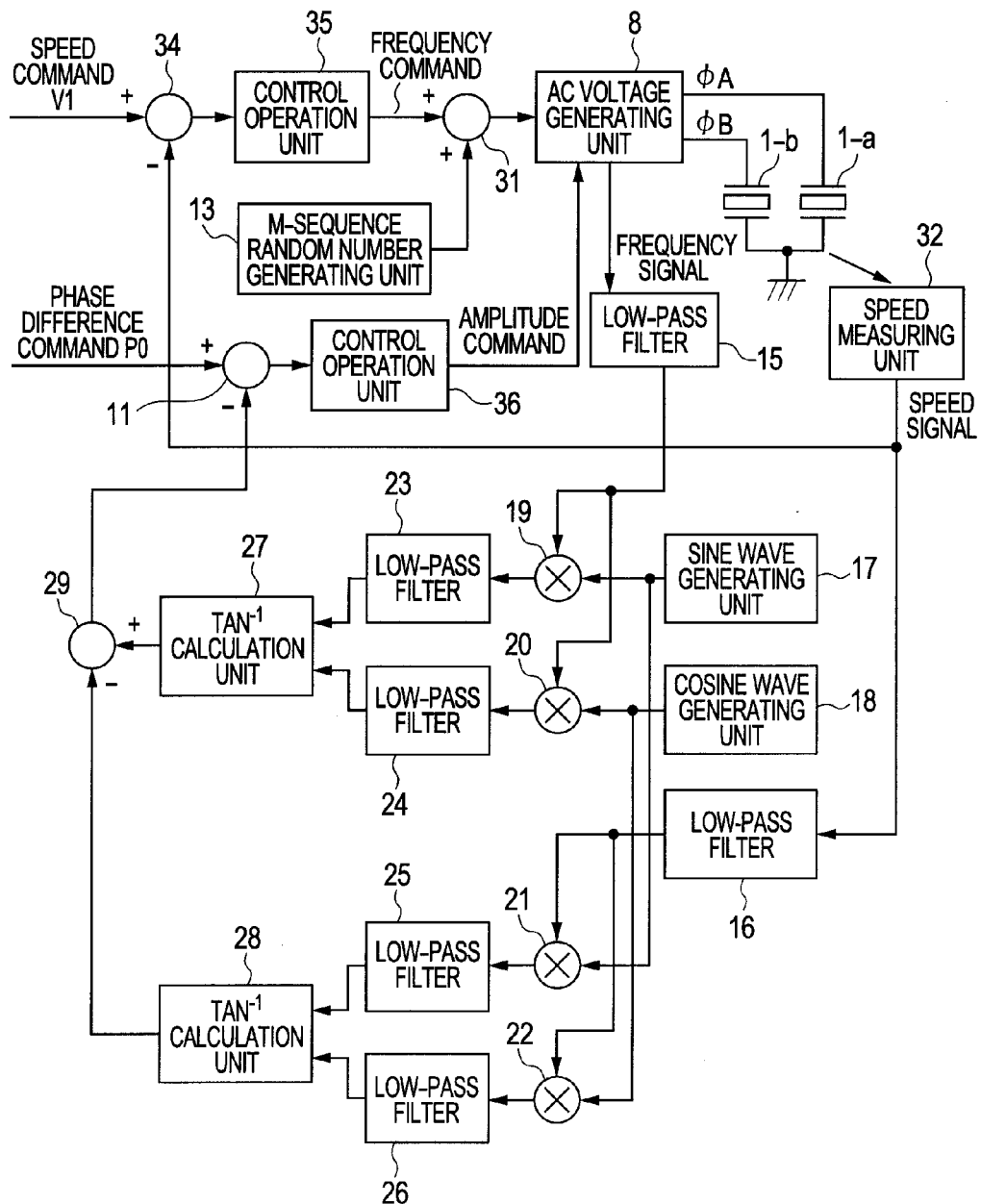
FIG. 9 is a block diagram for describing a configuration example of a controlling device for a vibration type actuator in a third embodiment of the present invention.

FIG. 9 is a block diagram for describing the configuration example of the controlling device for the vibration type actuator in this embodiment.

Figure 6:
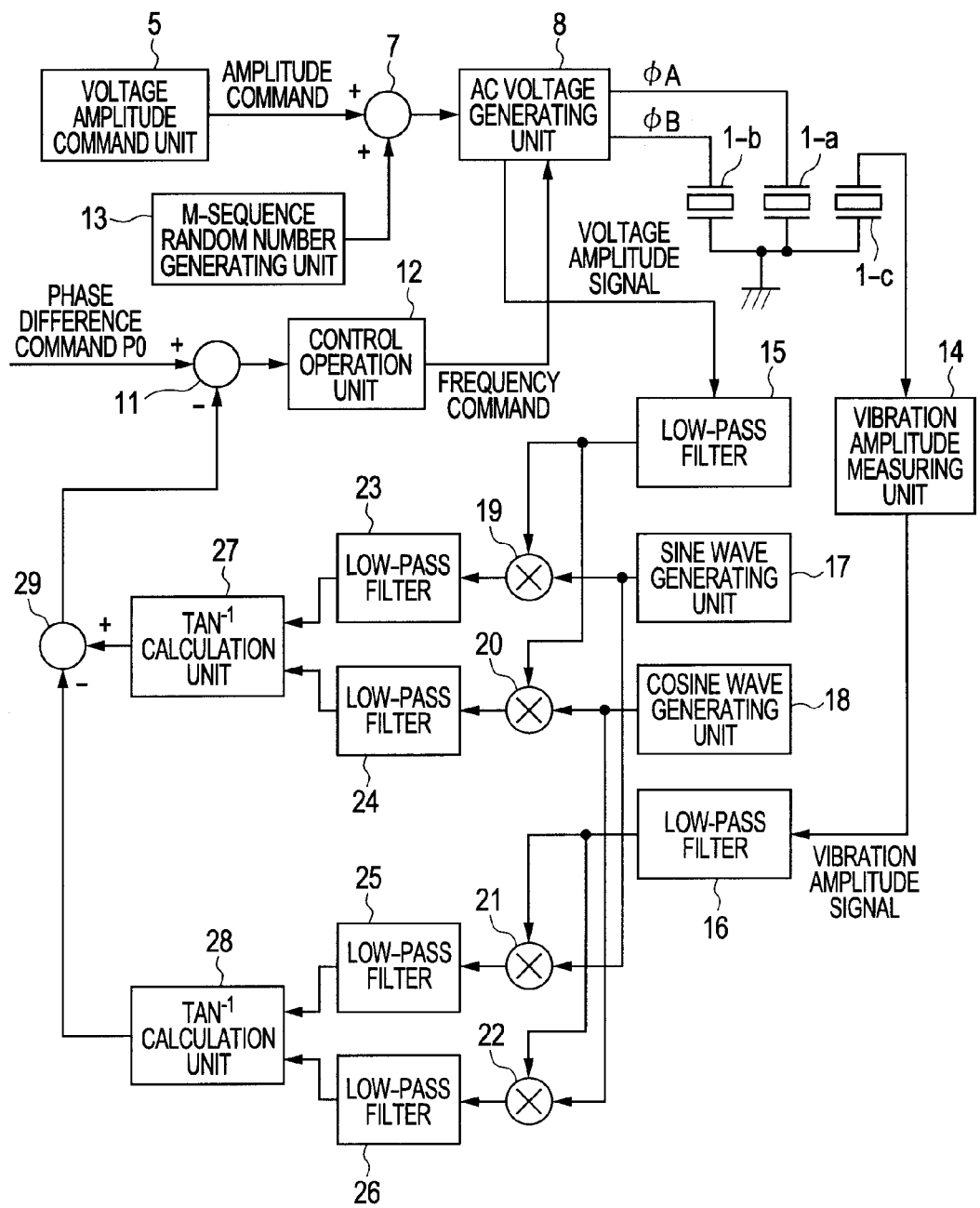
FIG. 6 is a block diagram for describing a second configuration example of the controlling device for the vibration type actuator in the first embodiment of the present invention.

Although a rough configuration is almost the same as the configuration of FIG. 6 described in the first embodiment, the configuration in this embodiment is different from the configuration of FIG. 6 in that the rotational speed of the rotor 4, which is not illustrated, is controlled following the speed command from a command unit, which is not illustrated.

Subsequently, the operation will be described without describing the portions for measuring the frequency response described in the above embodiments.

In FIG. 9, a speed comparison unit 34 compares a speed command V1 from the command unit, which is not illustrated, with the rotational speed of the rotor 4, which is not illustrated, from the speed measuring unit 32.

A control operation unit 35 performs a proportional integral calculation and controls the frequency of the AC voltage output from the AC voltage generating unit 8 by generating a frequency command so that the output from the speed comparison unit 34 is zero.

The addition unit 31 adds a random number output from the M-sequence random number generating unit 13 to the frequency command and then the frequency command on which the frequency variation of the amplitude of several tens of Hz or lower is superimposed is input to the AC voltage generating unit 8.

The variation has a variation range whose upper limit is about several times larger than the frequency resolution settable for the frequency of the AC voltage output from the AC voltage generating unit 8.

The imparting of the frequency variation stochastically varies the frequency of the AC voltage output from the AC voltage generating unit 8, thereby achieving an effect of increasing the frequency resolution in a pseudo manner.

The AC voltage generating unit 8 sets the frequency of the AC voltage by sampling a frequency command for each cycle of the output AC voltage on the basis of the frequency command on which an M-sequence random number output from the addition unit 31 is superimposed.

In addition, the sampled frequency is output as a frequency signal to a low-pass filter 15 which constitutes a frequency-response characteristic measuring unit.

Figure 10:
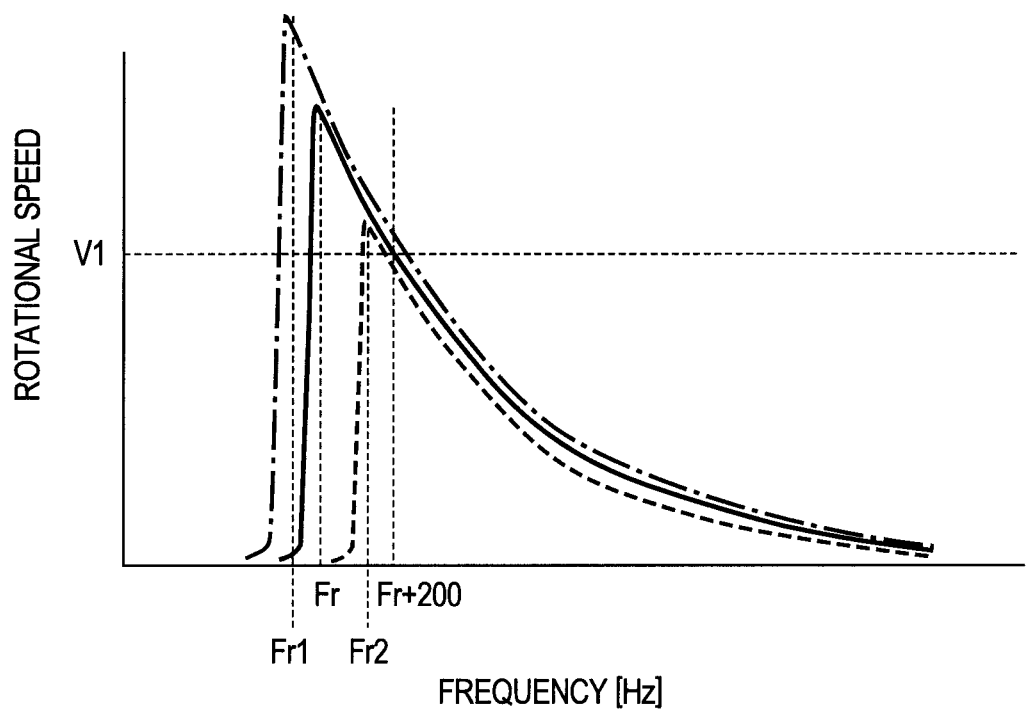
FIG. 10 is a diagram illustrating a relationship between the vibration frequency of a vibrating member and the rotational speed of a rotor in the third embodiment of the present invention.

FIG. 10 is a diagram illustrating a relationship between the vibration frequency of the vibrating member 2, which is not illustrated, and the rotational speed of the rotor 4, which is not illustrated.

The diagram illustrates the characteristics of the rotation at the maximum rotational speeds at the resonant frequencies Fr, Fr1, and Fr2 of the vibrating member 2.

The differences in the characteristic among the dashed line, the solid line, and the long dashed short dashed line represent differences in the characteristic caused by differences in the amplitude of the AC voltage output from the AC voltage generating unit 8. As the amplitude increases, the rotational speed increases. Fr, Fr1, and Fr2 indicate resonant frequencies of the vibrating member 2 in the respective voltage amplitudes. As the amplitude of the AC voltage increases, the resonant frequency decreases. In this embodiment, the rotational speed of the rotor 4, which is not illustrated, is controlled by using the property that the rotational speed of the rotor 4 increases as the frequency is closer to the resonant frequency Fr.

The speed measuring unit 32 considers the detected speed as a speed signal and outputs the speed signal to the speed comparison unit 34 and also to a low-pass filter 16 which constitutes a frequency-response characteristic measuring unit.

Subsequently, the operation will be described with respect to the stabilization of the frequency-response characteristic.

The frequency-response characteristic measuring unit includes components from the low-pass filters 15 and 16 to the phase difference detecting unit 29. The content thereof has been described in the first embodiment and therefore the description of the details will be omitted here.

The phase difference detecting unit 29 outputs a phase characteristic at 100 Hz. FIG. 8 shows the phase characteristic.

Here, the target phase characteristic is assumed to be a phase characteristic represented by the solid line and it is targeted to control the frequency of the AC voltage to follow the frequency 200 Hz higher than the resonant frequency Fr of the vibrating member 2, which is not illustrated.

Since the phase characteristic indicated by the solid line is P0 at 100 Hz with reference to FIG. 8, a command unit, which is not illustrated, issues a phase difference command P0.

The phase difference comparison unit 11 outputs a result of comparison between the output from the phase difference detecting unit 29 and the phase difference command P0.

A control operation unit 36 generates an amplitude command for issuing a command of the amplitude of the AC voltage output from the AC voltage generating unit 8 so that the output is zero.

Although the frequency-response characteristic has been stabilized by controlling the frequency of the AC voltage output from the AC voltage generating unit 8 in the above embodiment, the frequency-response characteristic is stabilized by controlling the amplitude of the AC voltage in this embodiment. The operation will be described by using the characteristics illustrated in FIG. 8 and FIG. 10.

Moreover, in this embodiment, the rotational speed of the rotor 4, which is not illustrated, is controlled by controlling the frequency of the AC voltage output from the AC voltage generating unit 8.

In the case where the frequency of the AC voltage is controlled according to the speed command V1 from the command unit, which is not illustrated, by using the characteristics of the respective curves in FIG. 10, the rotational speed depends on the amplitude of the AC voltage even at the same frequency, and therefore the frequency of the AC voltage is controlled to different frequencies.

Further, the resonant frequency of the vibrating member 2, which is not illustrated, changes according to the amplitude of the AC voltage, and therefore a difference between the frequency of the AC voltage and the resonant frequency of the vibrating member 2 changes even in the case of rotation at the same rotational speed.

Accordingly, it is understood that a difference between the frequency of the AC voltage and the resonant frequency of the vibrating member 2 can be changed by changing the amplitude of the AC voltage while controlling the frequency of the AC voltage so as to achieve the same rotational speed.

On the other hand, the solid line in FIG. 10 indicates the characteristic in which the rotational speed of the rotor 4, which is not illustrated, reaches V1 at the difference of 200 Hz between the frequency of the AC voltage and the resonant frequency of the vibrating member 2 and the solid line in FIG. 8 indicates the frequency-response characteristic at that condition.

Therefore, the following discusses a case where the phase characteristic at 100 Hz is greater than the phase difference command P0 in the phase characteristic in FIG. 8.

The state where the phase characteristic at 100 Hz is greater than the phase difference command P0 is a state where the difference between the frequency of the AC voltage and the resonant frequency of the vibrating member 2 is greater than 200 Hz.

In FIG. 10, the long dashed short dashed line indicates a state where the difference between the frequency of the AC voltage and the resonant frequency of the vibrating member 2 is greater than 200 Hz when the rotational speed of the rotor 4 is V1.

In FIG. 10, the long dashed short dashed line indicates the state where the amplitude of the AC voltage is large in comparison with the state of the solid line, and therefore the amplitude of the AC voltage may be reduced in order to bring the state of the long dashed short dashed line closer to the state of the solid line.

In other words, if the phase characteristic at 100 Hz is greater than the phase difference command P0, the operation may be controlled so that the amplitude command output from the control operation unit 36 is smaller.

Similarly, if the phase characteristic at 100 Hz is smaller than the phase difference command P0, in contrast, the operation may be controlled so that the amplitude command is larger.

Although the frequency of the AC voltage is changed to control and keep the frequency difference between the frequency of the AC voltage and the resonant frequency Fr of the vibrating member 2 constant in order to stabilize the phase characteristic in this embodiment, the present invention is not limited to this configuration.

For example, in the case where the frequency of the AC voltage is used to control another physical quantity, it is also possible to stabilize the phase characteristic by another control input of the AC voltage. Although the amplitude of the AC voltage has been manipulated as the control input in this embodiment, the same effect is achieved even by manipulating a temporal phase difference between two phases in the case of a vibration type actuator which is driven by two-phase AC voltages φA and φB.

Although the above vibration type actuator is driven with the phase difference between the two-phase AC voltages normally set to 90°, the rotational speed of the rotor 4 changes along with a shift of the phase difference from 90°.

It is because the rotational speed of the rotor 4 is changed by manipulating the temporal phase difference between the two phases, thereby changing the frequency of the AC voltage as a result.

Fourth Embodiment

A configuration example of a controlling device for a vibration type actuator according to a fourth embodiment will be described.

Figure 11:
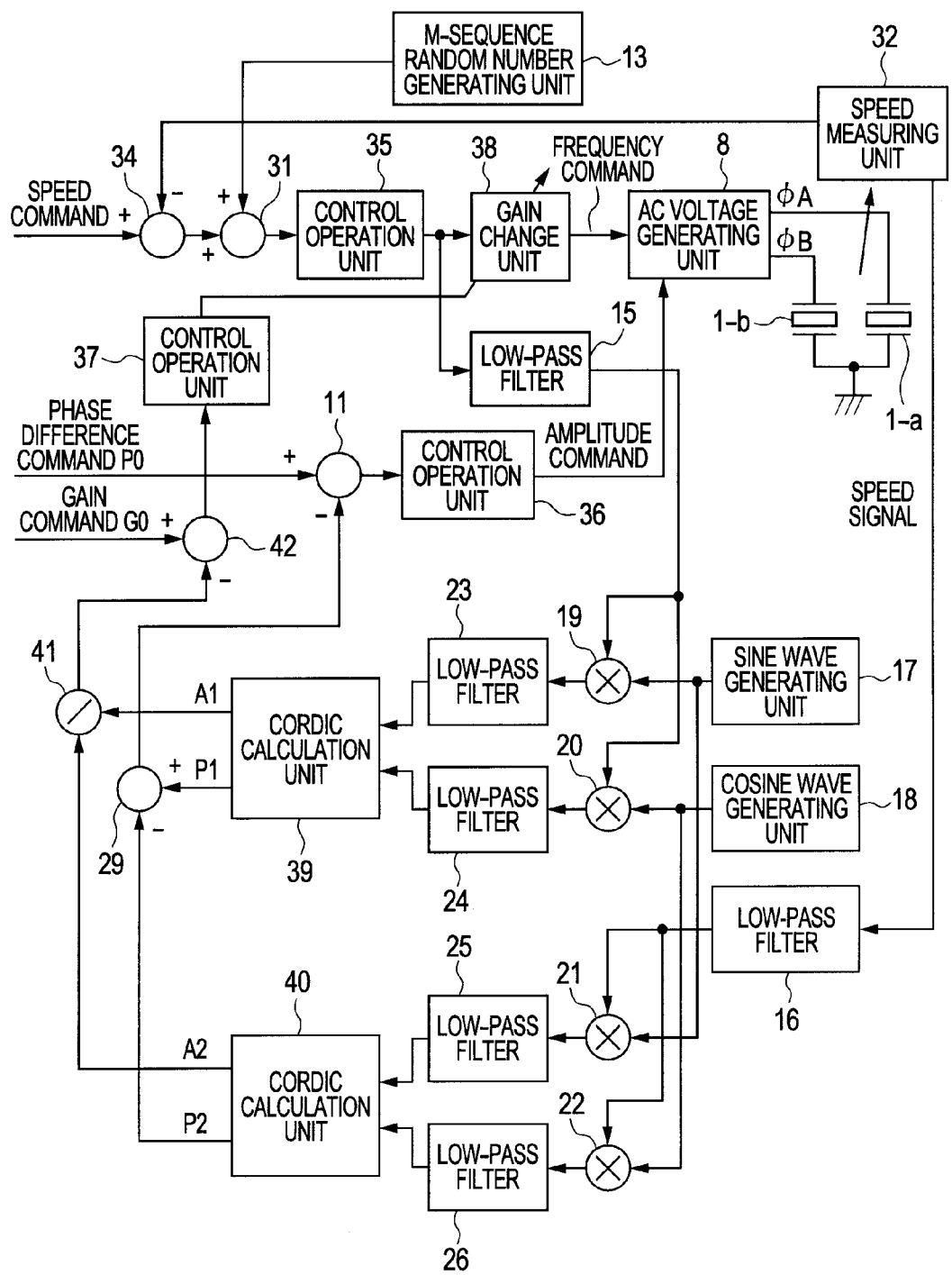
FIG. 11 is a block diagram for describing a configuration example of a controlling device for a vibration type actuator in a fourth embodiment of the present invention.

FIG. 11 is a block diagram for describing the configuration example of the controlling device for the vibration type actuator in this embodiment.

The rotational speed of the rotor 4, which is not illustrated, is controlled to a predetermined speed by controlling the frequency of the AC voltage output from the AC voltage generating unit 8 according to the speed command from the command unit, which is not illustrated. In addition, the phase characteristic of the frequency-response characteristic is stabilized by controlling the amplitude of the AC voltage, similarly to the third embodiment.

This embodiment is different from the above embodiments in that a control system is added to stabilize a gain characteristic of the frequency-response characteristic.

The following describes the configuration of this embodiment focusing on differences from FIG. 9.

Although the variation output from the M-sequence random number generating unit 13 has been imparted to the output from the control operation unit 35 by using the addition unit 31 in FIG. 9, the addition unit 31 is disposed in the front stage relative to the control operation unit 35 in this embodiment.

The imparting of the variation by the M-sequence random number generating unit 13 changes the frequency of the AC voltage output from the AC voltage generating unit 8 independently of the disposition in the front or rear stage relative to the control operation unit 35, and thus the frequency-response characteristic can be measured. A gain change unit 38 is able to manipulate a gain characteristic externally.

Moreover, while the frequency-response characteristic of the rotational speed of the rotor 4 is measured for the frequency of the AC voltage set by the AC voltage generating unit 8 in FIG. 9, the frequency-response characteristic of a complex system including the frequency-response characteristic of the gain change unit 38 is measured in this embodiment.

Therefore, a frequency-response characteristic including not only the characteristics of the vibration type actuator, but also the gain characteristic externally set by the gain change unit 38 is measured.

Moreover, while the phase characteristic has been found by using the arctangent calculation units 27 and 28 in order to measure only the phase characteristic in FIG. 9, the gain characteristic is detected at the same time as the phase characteristic by using the CORDIC calculation method, which is a known trigonometric function calculation method, in this embodiment.

CORDIC calculation units 39 and 40 perform a trigonometric function calculation by using the CORDIC calculation method.

The CORDIC calculation unit 39 finds an amplitude A1 and a phase P1 having a predetermined frequency included in an input signal of the gain change unit 38.

Further, the CORDIC calculation unit 40 finds an amplitude A2 and a phase P2 having a predetermined frequency included in a speed signal according to the rotational speed of the rotor 4, which is not illustrated, output from the speed measuring unit 32.

The ratio between the amplitude A1 and the amplitude A2 is the gain characteristic. A division unit 41 finds the gain characteristic by performing a division of A2/A1. A phase difference detecting unit 29 finds a phase characteristic which is a lag of the phase P2 relative to the phase P1.

Similarly to the operation of the third embodiment, the phase difference comparison unit 11 compares the output from the phase difference detecting unit 29 with the phase difference command P0 from the command unit, which is not illustrated, and the control operation unit 36 performs the proportional integral calculation and the like according to the comparison result and then outputs an amplitude command to the AC voltage generating unit 8.

A gain comparison unit 42 compares the gain command G0 with A2/A1 output from the division unit 41.

Regarding the output from the gain comparison unit 42, the control operation unit 37 adjusts the gain of the gain change unit 38 so that the output from the gain comparison unit 42 is zero.

Figure 12A:
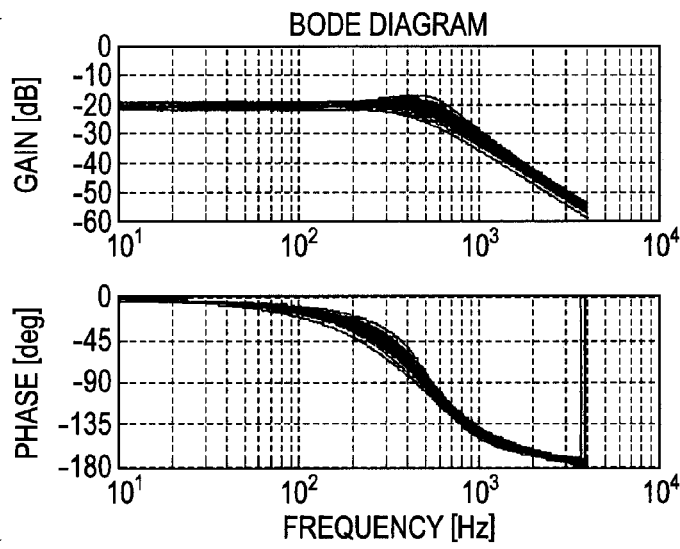
FIG. 12A is a Bode diagram for describing the effect of stabilization of a frequency-response characteristic of the vibration amplitude of the vibrating member relative to the frequency of the AC voltage applied to the piezoelectric element in the fourth embodiment of the present invention.
Figure 12B:
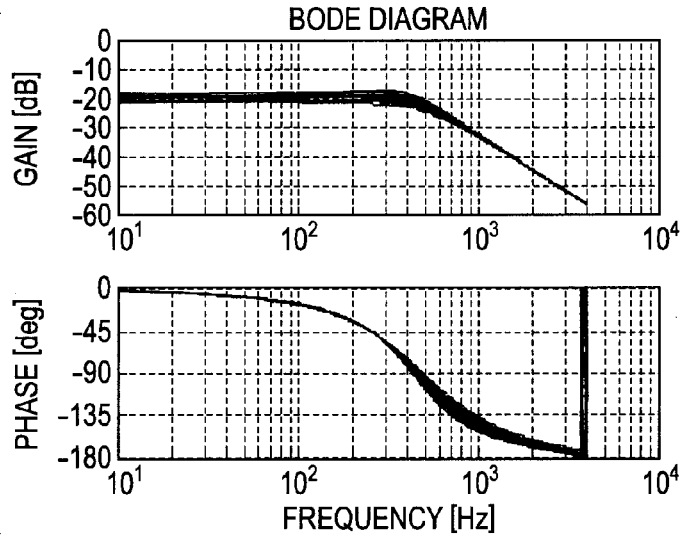
FIG. 12B is a Bode diagram for describing the effect of stabilization of a frequency-response characteristic of the vibration amplitude of the vibrating member relative to the frequency of the AC voltage applied to the piezoelectric element in the fourth embodiment of the present invention.
Figure 12C:
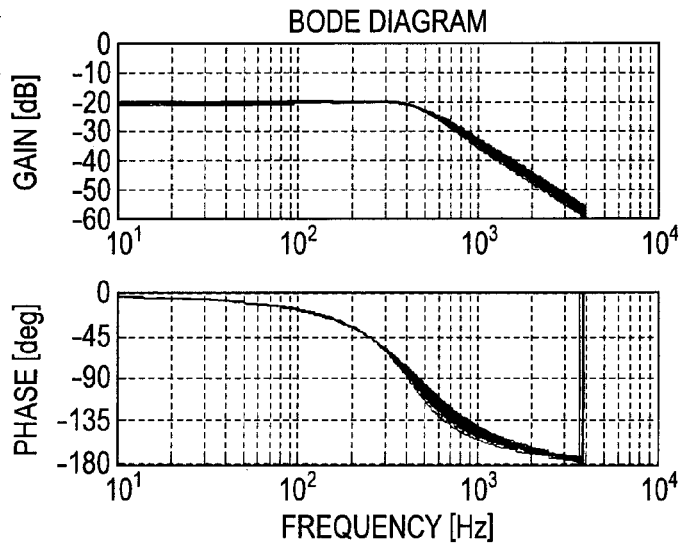
FIG. 12C is a Bode diagram for describing the effect of stabilization of a frequency-response characteristic of the vibration amplitude of the vibrating member relative to the frequency of the AC voltage applied to the piezoelectric element in the fourth embodiment of the present invention.

FIGS. 12A to 12C are diagrams illustrating a frequency-response characteristic of the rotor 4, which is not illustrated, relative to the frequency of the AC voltage output from the AC voltage generating unit 8.

FIG. 12A is a diagram illustrating a variability of the frequency-response characteristic, FIG. 12B illustrates a frequency-response characteristic after the phase characteristic is stabilized, and FIG. 12C illustrates a frequency-response characteristic after the gain characteristic is further stabilized.

The difference between the resonant frequency of the vibrating member 2, which is not illustrated, and the frequency of the AC voltage output from the AC voltage generating unit 8 corresponds to the frequency of the phase characteristic in the order of −90° and therefore the frequency difference is in the vicinity of 450 Hz.

Accordingly, a frequency 250 Hz, which is smaller than this, is selected and the phase difference is controlled to −45°. FIG. 12B illustrates a characteristic obtained by controlling the phase characteristic at 250 Hz to −45°.

In this manner, after stabilizing the phase characteristics at the frequencies lower than the difference frequency between the frequency of the AC voltage output from the AC voltage generating unit, namely the AC voltage applied to the piezoelectric elements 1-a and 1-b and the resonant frequency of the vibrating member 2, the phase characteristics at the frequencies lower than the frequency are stabilized.

In addition, it is known that stabilizing the phase characteristics at the frequencies higher than the difference frequency between the frequency of the AC voltage and the resonant frequency of the vibrating member 2 enables the stabilization of the phase characteristics in the vicinity of the frequency difference, but the phase characteristics on the lower frequency side are not stabilized so much.

Moreover, it is understood that the gain characteristics are not stabilized even after the phase characteristics are stabilized.

It suggests that then in the case where the frequency and the amplitude of the AC voltage are controlled so as to stabilize the variation of the gain characteristic in the low-frequency region including the direct current, the phase characteristic cannot be stabilized even if the gain characteristic can be stabilized.

FIG. 12C illustrates the frequency-response characteristic obtained by controlling the gain characteristic at 250 Hz in FIG. 12B to −20 dB. It is understood that the frequency characteristics at 250 Hz and lower are stabilized in both of the gain characteristic and the phase characteristic.

In this manner, the amplitude of the AC voltage output from the AC voltage generating unit 8 is controlled to stabilize the phase characteristics in the low-frequency area of the vibration type actuator and further the gain is adjusted to stabilize the frequency-response characteristic.

This stabilizes the frequency-response characteristic, which changes due to individual differences of the vibration type actuator, an environmental variation, a deterioration in durability of a friction section, thereby improving the reliability of the control characteristics sensitive to a change in the frequency-response characteristic of the vibration type actuator such as a speed variation characteristic and a quick-response performance.

Moreover, the characteristics in FIG. 12A are those for which individual differences of an inductor, a step-up transformer, and the like, which are not illustrated, for frequency characteristic matching for use in a drive circuit are considered in addition to the individual differences of the vibration type actuator, the environmental variation, and the deterioration in durability.

As described above, even if the characteristic variation is caused by an element other than the vibration type actuator, the characteristic variation can be stabilized by using the property of a change in the frequency-response characteristic of the vibration type actuator.

Fifth Embodiment

A configuration example of a controlling device for a vibration type actuator in a fifth embodiment will be described below.

Figure 13:
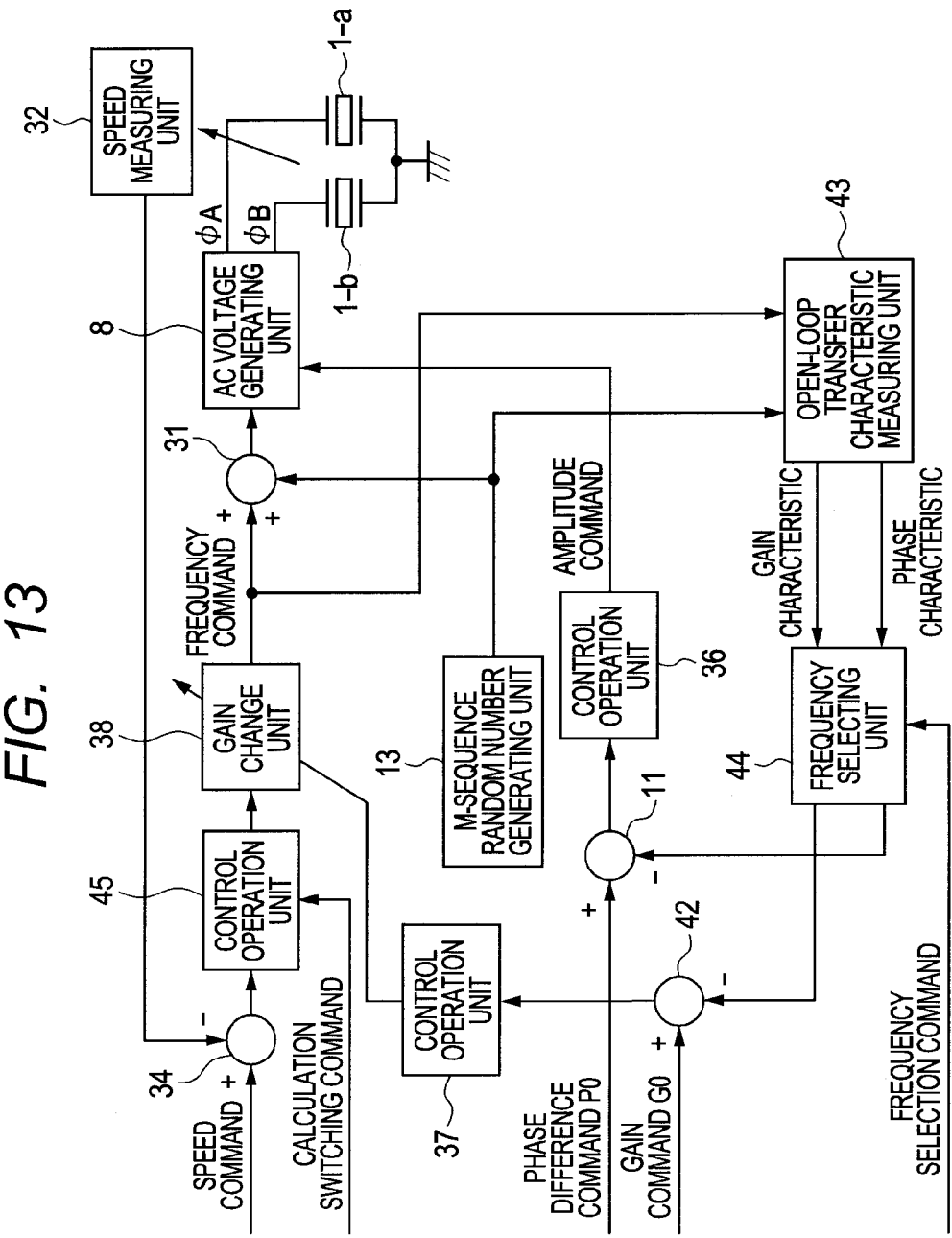
FIG. 13 is a block diagram for describing a configuration example of a controlling device for a vibration type actuator in a fifth embodiment of the present invention.

FIG. 13 is a block diagram for describing the configuration example of the controlling device for the vibration type actuator in this embodiment.

In the fourth embodiment, the frequency-response characteristic has been stabilized in the system in which the frequency-response characteristic of the gain change unit 38 and the frequency-response characteristic of the rotational speed of the rotor 4, which is not illustrated, to the frequency of the AC voltage output from the AC voltage generating unit 8 are connected in series.

Whereas in this embodiment, an open-loop transfer characteristic of a control loop for controlling the rotational speed of the rotor 4 is stabilized by controlling the frequency of the AC voltage output from the AC voltage generating unit 8 according to a speed command from a command unit, which is not illustrated.

The control loop constituent elements include the speed comparison unit 34, a control operation unit 45 described later, the gain change unit 38, the addition unit 31, the AC voltage generating unit 8, the vibrating member 2, the rotor 4, and the speed measuring unit 32. The term "open-loop transfer characteristic" here means a frequency-response characteristic of the system in which these constituent elements are connected in series.

In this embodiment, as to a method of measuring the open-loop transfer characteristic, the open-loop transfer characteristic is found by a calculation on the basis of a characteristic obtained by measuring the frequency-response characteristic between two input signals of the addition unit 31. An open-loop transfer characteristic measuring unit 43 measures the frequency-response characteristic of a closed loop, which is an output from the gain change unit 38 to the output from the M-sequence random number generating unit 13, and performs the calculation for a change from the closed loop to the open loop.

The open-loop transfer characteristic measuring unit 43 has a function of measuring a gain characteristic and a phase characteristic at a plurality of frequencies.

A frequency selecting unit 44 selects a gain characteristic and a phase characteristic at a desired frequency out of the above plurality of frequencies in response to a frequency selection command issued from a command unit, which is not illustrated.

The gain characteristic selected by the frequency selecting unit 44 is output to the gain comparison unit 42 and then compared with a gain command G0 issued from a command unit, which is not illustrated.

According to the gain comparison result, the control operation unit (the second adjusting unit) 37 adjusts the gain of the gain change unit 38 to stabilize the gain characteristic at a predetermined frequency of the open-loop transfer characteristic.

The phase characteristic selected by the frequency selecting unit 44 is output to the phase difference comparison unit 11 and compared with the phase difference command P0 issued from a command unit, which is not illustrated.

According to the phase comparison result, the control operation unit (the first adjusting unit) 36 controls the amplitude of the AC voltage output from the AC voltage generating unit 8 to stabilize the phase characteristic at a predetermined frequency of the open-loop transfer characteristic.

In addition, a control operation unit 45 is able to switch the respective coefficients of a proportional integral calculation according to a calculation switching command issued from a command unit, which is not illustrated, and switches the coefficients of the proportional integral calculation in response to the speed command issued from the command unit, which is not illustrated. Thereby, the above open-loop transfer characteristic is set optimally for each speed command.

Figure 14:
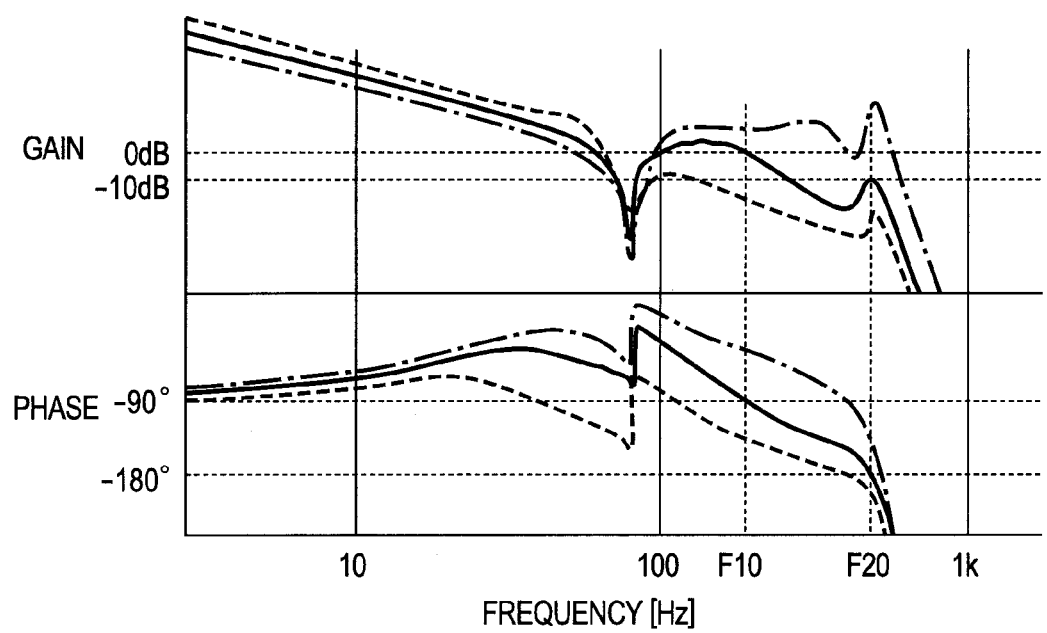
FIG. 14 is a Bode diagram illustrating an example of an open-loop transfer characteristic in the fifth embodiment of the present invention.

FIG. 14 is a diagram illustrating an example of the open-loop transfer characteristic in this embodiment.

This diagram exhibits prominent characteristics: an integral characteristic having a linear slope characteristic at 100 Hz or lower; and peaks in the vicinity of 80 Hz and F20 caused by a mechanical resonant system between the rotor 4, which is not illustrated, and the speed measuring unit 32.

The solid line represents a target open-loop transfer characteristic corresponding to a speed command and the open-loop transfer characteristic is achieved when the frequency difference between the frequency of the AC voltage output from the AC voltage generating unit 8 and the resonant frequency of the vibrating member 2, which is not illustrated, reaches a predetermined frequency.

The dashed line represents an open-loop transfer characteristic observed when the frequency is lower than the predetermined frequency, and the long dashed short dashed line represents an open-loop transfer characteristic observed when the frequency is higher than the predetermined frequency.

Subsequently, the stabilization of the open-loop transfer characteristic will be described by using the characteristics in FIG. 14.

First, the characteristic represented by the solid line in FIG. 14 is set as a target of the open-loop transfer characteristic so as to correspond to the speed command issued from the command unit, which is not illustrated.

In response to this, frequency F10 is specified for a frequency selection command to the frequency selecting unit 44 and then the gain command G0 is set to 0 dB and the phase difference command P0 is set to −90°.

Moreover, a proportional-integral coefficient corresponding to the speed command is specified also for the control operation unit 45. Thereupon, the frequency and amplitude of the AC voltage output from the AC voltage generating unit 8 are controlled by the same operation as for the fourth embodiment and the phase and gain of the open-loop transfer characteristic are controlled by the phase difference command P0 and the gain command G0. Here, the values of the phase margin and the gain margin, which are obtained by measuring the open-loop transfer characteristic, are important to know the degree of stability of the control system.

It is because the control system is stable only after the phase margin and the gain margin satisfy predetermined conditions.

Viewing the open-loop transfer characteristic represented by the solid line in FIG. 14, the gain characteristic reaches 0 dB at frequency F10 and the phase characteristic at that time is −90° and therefore the phase margin is 90°.

The gain characteristic at frequency F20 where the phase characteristic reaches −180° is −10 dB and the gain margin is 10 dB.

This state generally satisfies the conditions of stability, and the open-loop transfer characteristic represented by the solid line is stable. The optimum values of the phase margin and the gain margin depend on necessary control performances and thus the above values are not necessarily appropriate. It is, however, preferable that the phase margin is 20° or higher and the gain margin is 3 dB or more FIGS. 15A and 15B illustrate an open-loop transfer characteristic based on another speed command.

Figure 15A:
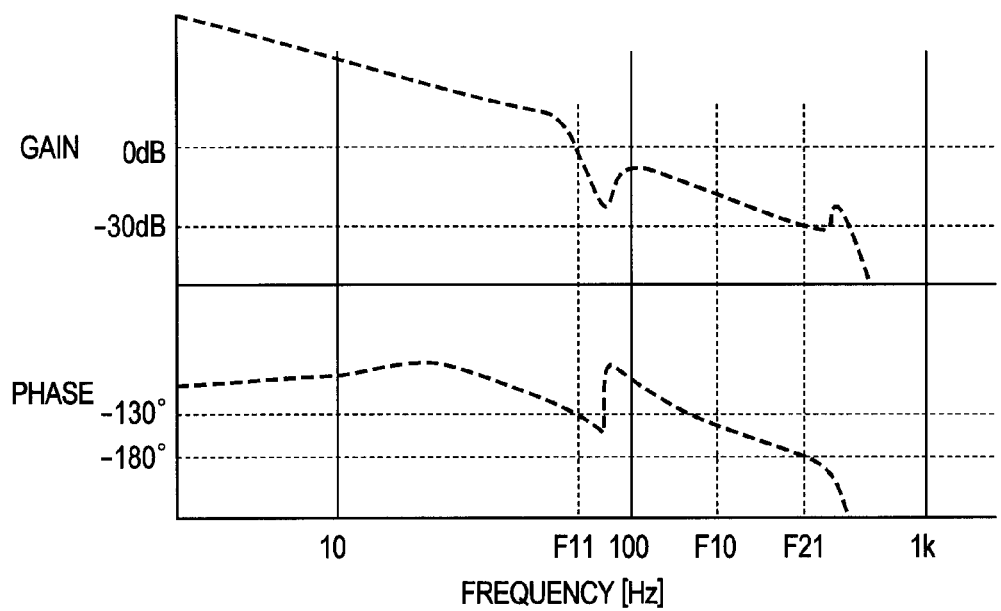
FIG. 15A is a diagram for describing the necessity of switching in a proportional integral calculation according to a speed command in the fifth embodiment of the present invention.

FIG. 15A illustrates a characteristic based on a speed command higher than the speed command represented by the solid line in FIG. 14. As for the phase margin, the phase characteristic at frequency F11 is −130° and therefore the phase margin is 50°. The gain margin is 30 dB on the basis of the gain characteristic at frequency F21. They are sufficiently stable characteristics.

Figure 15B:
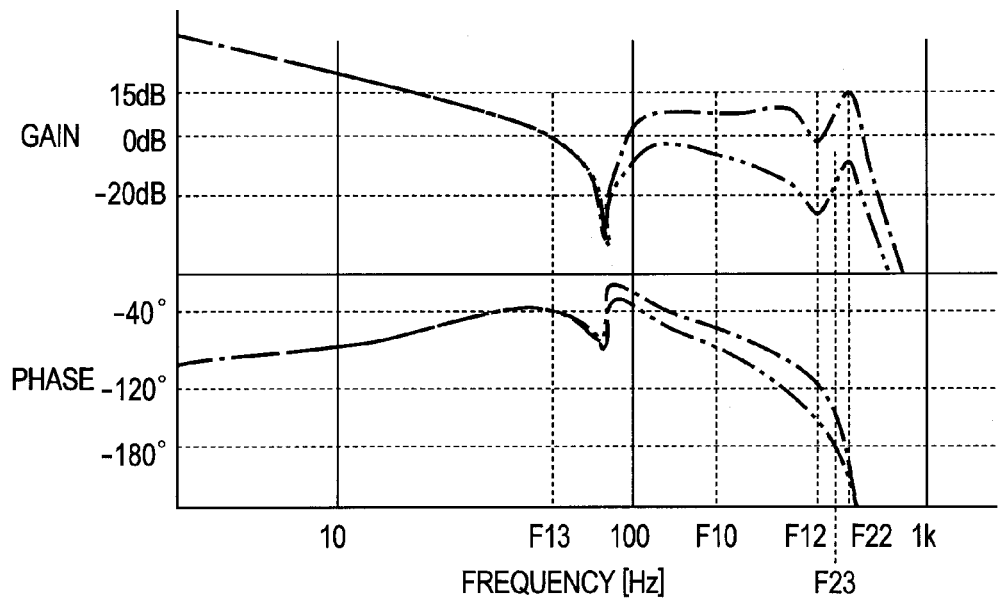
FIG. 15B is a diagram for describing the necessity of switching in the proportional integral calculation according to the speed command in the fifth embodiment of the present invention.

FIG. 15B illustrates a characteristic based on a speed command lower than the speed command represented by the solid line in FIG. 14, exhibiting a characteristic represented by the long dashed short dashed line in FIG. 14 and a characteristic improved therefrom represented by a two-dot chain line.

The phase margin of the characteristic represented by the long dashed short dashed line is 60° from the phase characteristic at the frequency F12. The gain margin is −15 dB from the gain characteristic at frequency F22, which is not a sufficient margin. It suggests that the characteristic represented by the long dashed short dashed line has a sufficient phase margin, but the gain margin does not satisfy the stability condition.

The control system cannot be stably operated under this condition. Therefore, a command of a proportional-integral coefficient according to the speed command is issued to the control operation unit 45 to stabilize the open-loop transfer characteristic.

The characteristic represented by the two-dot chain line in FIG. 15B is obtained by correcting and improving the proportional-integral coefficient. As a result of the improvement, the phase margin is 140° from the phase characteristic at frequency F13 and the gain margin is 20 dB from the gain characteristic at frequency F23.

These characteristics are sufficiently stable. In this manner, the gain margin and the phase margin can be set to sufficiently large values in a wide speed region while achieving the stability of the open-loop transfer characteristic by setting the proportional-integral coefficient of the control operation unit 45 by using the calculation switching command according to the speed command.

Moreover, although the gain characteristic and the phase characteristic at the frequency F10 are stabilized in the above description of this embodiment, any other frequency is applicable.

For example, the gain characteristic is set to 0 dB at the frequency F10 for the characteristic represented by the solid line in FIG. 14, at the frequency F11 for the characteristic in FIG. 15A, and at the frequency F13 for the characteristic in FIG. 15B. Therewith, a gain command and a phase difference command are set so as to achieve a phase characteristic having a value of −160° or higher, thereby stabilizing the phase margin.

Moreover, to stabilize the gain margin, it is conceivable that the phase characteristic is set as described below at the frequency F20 for the characteristic represented by the solid line in FIG. 14, at the frequency F21 for the characteristic in FIG. 15A, and at the frequency F23 for the characteristic in FIG. 15B.

Specifically, it is conceivable that the gain command and the phase difference command are set so that the phase characteristic of each of the above cases is −180° and that the target gain is 0.7 or a lower value of the gain characteristic.

Moreover, although a large phase margin and a large gain margin contribute to the stabilization, it is generally known that there is a need to achieve a balance between the stabilization and the control performance according to a purpose since a trade-off relationship exists between the stabilization and the control performance.

As described above, the stabilization of the frequency characteristic suitable for the speed command is selectable by switching the frequency selection command according to the speed command from the command unit, which is not illustrated.

Moreover, in the case of controlling the open-loop transfer characteristic in real time, it is necessary to perform filtering to prevent the gain characteristic or phase characteristic from being suddenly changed even if some noise is mixed in an input of the open-loop transfer characteristic measuring unit 43.

Moreover, naturally the upper and lower limits are set for the range of settable gains. Further, it is also necessary to take measures such as selecting a stable initial gain after due consideration of variability of the open-loop transfer characteristic at the initial stage of the startup and waiting for a period of time until the control system is stabilized before the gain change is validated. Moreover, predetermined upper and lower limits are also set for the amplitude command output from the control operation unit 36 and the frequency command output from the gain change unit 38. At the initial stage of the startup, the predetermined initial amplitude and initial frequency are set.

Moreover, although the amplitude command is output from the control operation unit 36 in this embodiment, the same effect is achieved by issuing a command of a temporal phase difference between the two-phase AC voltages φA and φB output from the AC voltage generating unit 8.

Specifically, it is because, similarly to that the speed of the rotor 4, which is not illustrated, increases as the amplitude command is increased and the speed decreases as the amplitude command is decreased, the speed increases as the phase difference between φA and φB is brought closer to 90° and the speed decreases as the phase difference is brought closer to 0°.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-280714, filed Dec. 16, 2010, which is hereby incorporated by reference herein in its entirety.

The invention claimed is:

1. A controlling device for a vibration type actuator, the controlling device comprising:
   an AC voltage generating unit in which at least one of a frequency, an amplitude, and a phase of an AC voltage is settable, the AC voltage to be applied to the vibration type actuator;
   a measuring unit which measures at least one physical quantity of the vibration of a vibrating member of the vibration type actuator or a mechanism connected to the vibrating member, the sound propagating in a medium surrounding the vibrating member, a speed of a moving member of the vibration type actuator, a position of the moving member, and a force output by the moving member;
   a variation imparting unit which imparts a variation to at least one of the frequency, the amplitude, and the phase of the AC voltage generated by the AC voltage generating unit, the variation imparting unit being isolated from the measuring unit;
   a frequency-response characteristic measuring unit which finds a frequency-response characteristic of at least one frequency between a first signal according to the variation imparted by the variation imparting unit and a second signal according to the at least one physical quantity measured by the measuring unit; and
   a frequency controlling unit which controls a frequency of the AC voltage generated by the AC voltage generating unit according to the frequency-response characteristic found by the frequency-response characteristic measuring unit.

2. The controlling device for the vibration type actuator according to claim 1, wherein the frequency controlling unit controls the frequency of the AC voltage according to the phase characteristic found as the frequency-response characteristic by the frequency-response characteristic measuring unit.

3. The controlling device for the vibration type actuator according to claim 2, wherein the frequency controlling unit controls the frequency of the AC voltage so as to achieve the phase characteristic equal to a target phase.

4. The controlling device for the vibration type actuator according to claim 3, wherein the frequency for use in finding the frequency-response characteristic is a frequency which is equal to or lower than a difference frequency between the frequency of the AC voltage and a resonant frequency of the vibrating member and further which is equal to or higher than one tenth of the difference frequency.

5. The controlling device for the vibration type actuator according to claim 1, wherein the variation imparting unit imparts one of a sine-wave signal, a white noise, and a pseudo-random signal.

6. The controlling device for the vibration type actuator according to claim 1, wherein:
the frequency-response characteristic measuring unit includes:
a waveform generating section which generates a sine wave and a cosine wave of at least one frequency;
a multiplication operation section which multiplies each of the sine wave and the cosine wave output from the waveform generating section by each of the first signal and the second signal; and
a low-pass filter unit which performs a filtering calculation for an output signal of the multiplication operation section; and
the frequency-response characteristic measuring unit measures a frequency-response characteristic between the first signal and the second signal by using a result of the calculation for each frequency performed by the low-pass filter unit.

7. The controlling device for the vibration type actuator according to claim 1, wherein the first signal is a signal to be input to the variation imparting unit.

8. The controlling device for the vibration type actuator according to claim 1, wherein the at least one of the frequency, the amplitude, and the phase of an AC voltage is for use in applying an excitation force to the vibrating member.

9. The controlling device for the vibration type actuator according to claim 1, wherein the at least one physical quantity of the vibration amplitude of the vibrating member, the speed of the moving member, the position of the moving member, and the force to be output of the moving member measured by the measuring unit changes according to the vibration of the vibrating member.

10. The controlling device for the vibration type actuator according to claim 1, wherein the moving member is in contact with or indirectly connected to the vibrating member, and
wherein the moving member and the vibration member move relatively to each other by using the vibration wave excited by the vibrating member due to a frictional force generated by the vibration wave.

11. A controlling device for a vibration type actuator, the controlling device comprising:
an AC voltage generating unit in which at least one of a frequency, an amplitude, and a phase of an AC voltage is settable, the AC voltage to be applied to the vibration type actuator;
a measuring unit which measures at least one physical quantity of the vibration amplitude of a vibrating member of the vibration type actuator, a speed of a moving member of the vibration type actuator, a position of the moving member, and a force output the moving member;
a comparison unit which compares a value based on the physical quantity measured by the measuring unit and a target value;
a control operation unit which performs a control operation according to a result of the comparison by the comparison unit between the value based on the physical quantity measured by the measuring unit and the target value;
a variation imparting unit which imparts a variation to at least one of the frequency, the amplitude, and the phase of the AC voltage generated by the AC voltage generating unit;
a frequency-response characteristic measuring unit which finds a phase characteristic, which is a frequency-response characteristic of at least a frequency between a first signal according to the variation imparted by the variation imparting unit and a second signal according to an output from the control operation unit or the physical quantity measured by the measuring unit; and
an adjusting unit which sets at least one of the frequency, the amplitude, and the phase of the AC voltage generated by the AC voltage generating unit according to the phase characteristic.

12. The controlling device for the vibration type actuator according to claim 11, wherein:
the frequency-response characteristic measuring unit has a function of finding a gain characteristic of at least a frequency; and
the controlling device has a second adjusting unit which adjusts the gain characteristic of the control operation unit according to the gain characteristic.

13. The controlling device for the vibration type actuator according to claim 11, wherein the first adjusting unit sets at least one of the frequency, the amplitude, and the phase of the AC voltage so that the phase characteristic of the frequency output from the frequency-response characteristic measuring unit is equal to a target phase.

14. The controlling device for the vibration type actuator according to claim 13, wherein the frequency for use in finding the frequency-response characteristic is a frequency which is equal to or lower than a difference frequency between the frequency of the AC voltage and a resonant frequency of the vibrating member and further which is equal to or higher than one tenth of the difference frequency.

15. The controlling device for the vibration type actuator according to claim 12, wherein the second adjusting unit adjusts the gain characteristic of the control operation unit so that the gain characteristic of the frequency output from the frequency-response characteristic measuring unit is equal to a target gain.

16. The controlling device for the vibration type actuator according to claim 11, wherein the frequency-response characteristic measuring unit measures an open-loop transfer characteristic.

17. The controlling device for the vibration type actuator according to claim 16, wherein the target gain at the frequency is set to 0.7 or lower and the target phase is set to −180°.

18. The controlling device for the vibration type actuator according to claim 16, wherein the target gain at the frequency is set to 1 and the target phase is set to −160° or higher.

19. The controlling device for the vibration type actuator according to claim 11, wherein the frequency is set according to a target value of the speed of the moving member or the vibration amplitude of the vibrating member.

20. The controlling device for the vibration type actuator according to claim 13, wherein the target phase is set according to a target value of the speed of the moving member or the vibration amplitude of the vibrating member.

21. A vibration type actuator comprising:
the vibrating member;
the moving member; and
the controlling device for the vibration type actuator according to claim 1.

22. A vibration type actuator comprising:
the vibrating member;
the moving member; and
the controlling device for the vibration type actuator according to claim 11.

\* \* \* \* \*